United States Patent
Park et al.

(10) Patent No.: US 9,852,804 B2
(45) Date of Patent: Dec. 26, 2017

(54) NONVOLATILE MEMORY DEVICE, MEMORY SYSTEM, METHOD OF OPERATING NONVOLATILE MEMORY DEVICE, AND METHOD OF OPERATING MEMORY SYSTEM

(71) Applicant: SAMSUNG ELECTRONICS CO., LTD., Suwon-si, Gyeonggi-do (KR)

(72) Inventors: Jong-Chul Park, Hwaseong-si (KR); Hyun-Young Yoo, Seoul (KR); Sang-Soo Park, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/281,837

(22) Filed: Sep. 30, 2016

(65) Prior Publication Data

US 2017/0162270 A1 Jun. 8, 2017

(30) Foreign Application Priority Data

Dec. 4, 2015 (KR) ........................ 10-2015-0172662

(51) Int. Cl.
| | |
|---|---|
| G11C 11/34 | (2006.01) |
| G11C 16/04 | (2006.01) |
| G11C 16/34 | (2006.01) |
| G11C 16/10 | (2006.01) |
| G11C 16/26 | (2006.01) |
| G11C 29/02 | (2006.01) |

(52) U.S. Cl.
CPC .......... *G11C 16/3431* (2013.01); *G11C 16/10* (2013.01); *G11C 16/26* (2013.01); *G11C 29/021* (2013.01); *G11C 29/028* (2013.01); *G11C 16/0483* (2013.01)

(58) Field of Classification Search
CPC . G11C 16/3431; G11C 16/0483; G11C 16/26; G11C 16/10
See application file for complete search history.

(56) References Cited

U.S. PATENT DOCUMENTS

| | | | |
|---|---|---|---|
| 8,072,805 B2 | 12/2011 | Chou et al. | |
| 8,514,646 B1 | 8/2013 | Nan | |
| 8,659,966 B2 | 2/2014 | Choi et al. | |
| 8,908,460 B2 | 12/2014 | Mun et al. | |
| 9,001,587 B2 | 4/2015 | Eun et al. | |
| 9,431,123 B2 * | 8/2016 | Kim ..................... G11C 29/028 |
| 2013/0080858 A1 | 3/2013 | Lee et al. | |
| 2013/0103913 A1 | 4/2013 | Seol et al. | |

(Continued)

*Primary Examiner* — Toan Le
(74) *Attorney, Agent, or Firm* — F. Chau & Associates, LLC

(57) ABSTRACT

A method of operating a nonvolatile memory device that includes a three-dimensional (3D) memory cell array is provided as follows. A first read operation is performed on first memory cells connected to a first word line by using a first read voltage level. A read retry operation is, if the first read operation fails, performed on the first memory cells so that a read retry voltage level is set to a second read voltage level. A read offset table is determined based on a difference between the first read voltage level and the second read voltage level. The read offset table stores a plurality of read voltage offsets. A second read operation is performed on second memory cells connected to a second word line by using a third read voltage level determined using the read offset table.

19 Claims, 30 Drawing Sheets

(56) References Cited

U.S. PATENT DOCUMENTS

| | | |
|---|---|---|
| 2015/0006983 A1 | 1/2015 | Lin et al. |
| 2015/0049548 A1 | 2/2015 | Park et al. |
| 2015/0113207 A1 | 4/2015 | Shin |
| 2016/0124642 A1* | 5/2016 | Kim .................. G06F 3/061 |
| | | 711/156 |
| 2016/0124647 A1* | 5/2016 | Kim .................. G06F 3/0604 |
| | | 711/167 |
| 2016/0180946 A1* | 6/2016 | Hong .................. G11C 16/26 |
| | | 365/185.11 |
| 2016/0189770 A1* | 6/2016 | Abe .................. G11C 11/5642 |
| | | 365/185.03 |

* cited by examiner

FIG. 10A

ROT-BLK

| BLOCK | ROT |
|-------|------|
| BLK1 | ROT1 |
| BLK2 | ROT2 |
| BLK3 | ROT3 |
| ... | ... |
| BLKz | ROTz |

FIG. 10B

ROT-MAT

| MAT | ROT |
|------|------|
| MAT1 | ROT1 |
| MAT2 | ROT2 |
| MAT3 | ROT3 |
| ... | ... |
| MATk | ROTk |

FIG. 10C

ROT-CHIP

| CHIP | ROT |
|------|-----|
| CHIP1 | ROT1 |
| CHIP2 | ROT2 |
| CHIP3 | ROT3 |
| ... | ... |
| CHIPm | ROTm |

NONVOLATILE MEMORY DEVICE, MEMORY SYSTEM, METHOD OF OPERATING NONVOLATILE MEMORY DEVICE, AND METHOD OF OPERATING MEMORY SYSTEM

CROSS-REFERENCE TO RELATED APPLICATION

This application claims priority under 35 U.S.C. §119 to Korean Patent Application No. 10-2015-0172662, filed on Dec. 4, 2015, in the Korean Intellectual Property Office, the disclosure of which is incorporated by reference herein in its entirety.

TECHNICAL FIELD

The present inventive concept relates to a nonvolatile memory device, a memory system including the nonvolatile memory device, a method of operating the nonvolatile memory device, and a method of operating the memory system.

DISCUSSION OF RELATED ART

Memory devices storing data are classified as volatile memory devices or nonvolatile memory devices. As an example of the nonvolatile memory devices, flash memory devices are used in mobile phones, digital cameras, personal digital assistants (PDA), portable computer devices, computer devices, and other devices.

SUMMARY

According to an exemplary embodiment, a method of operating a nonvolatile memory device that includes a three-dimensional (3D) memory cell array is provided as follows. A first read operation is performed on first memory cells connected to a first word line by using a first read voltage level. A read retry operation is, if the first read operation fails, performed on the first memory cells so that a read retry voltage level is set to a second read voltage level. A read offset table is determined based on a difference between the first read voltage level and the second read voltage level. The read offset table stores a plurality of read voltage offsets. A second read operation is performed on second memory cells connected to a second word line by using a third read voltage level determined using the read offset table.

According to an exemplary embodiment of the present inventive concept, a method of operating a memory system including a nonvolatile memory device that includes a 3D memory cell array and a memory controller configured to control the nonvolatile memory device is provided as follows. A first read operation is performed on first memory cells connected to a first word line by using a first read voltage level. A read retry operation is performed, if the first read operation fails, using a read retry voltage on the first memory cells. The read retry voltage is set to a second read voltage level in the read retry operation. The memory controller determines a read offset table based on a difference between the first read voltage level and the second read voltage level. The read offset table stores a plurality of read voltage offsets. The memory controller sends a read voltage offset selected from the plurality of read voltage offsets of the read offset table to the nonvolatile memory device. The selected read voltage offset corresponds to a second word line. A second read operation is performed on second memory cells connected to the second word line by using the selected read voltage offset.

According to an exemplary embodiment of the present inventive concept, a method of operating a memory system including a nonvolatile memory device that includes a 3D memory cell array and a memory controller configured to control the nonvolatile memory device is provided. A first read operation is performed on first memory cells connected to a first word line by using a first read voltage level. A read retry operation is performed, if the first read operation fails, on the first memory cells using a read retry voltage level. The read retry voltage level is set to a second read voltage level. The memory controller determines a read offset table based on a difference between the first read voltage level and the second read voltage level. The read offset table stores a plurality of read voltage offsets. The memory controller determines a third read voltage level by using the read offset table. A second read operation is performed on second memory cells connected to the second word line by using the third read voltage level.

According to an exemplary embodiment of the present inventive concept, a nonvolatile memory device is provided as follows. A memory cell array includes a plurality of memory cells connected to a plurality of word lines vertically stacked on a substrate. A control logic circuit performs a first read operation and a read retry operation on a first word line to determine a read offset table according to a difference between a default read voltage level of the first read operation and a read retry voltage level of the read retry operation, and performs a second read operation on a second word line by using the read offset table. The read offset table stores a plurality of read voltage offsets. Each of the plurality of read voltage offsets is set in a unit of a predetermined number of word lines among the plurality of word lines.

According to an exemplary embodiment of the present inventive concept, a memory system is provided as follows. A memory device includes a plurality of memory cells connected to a plurality of word lines vertically stacked on a substrate. A memory controller performs a first read operation and a read retry operation on a first word line to determine a read offset table according to a difference between a default read voltage level of the first read operation and a read retry voltage level of the read retry operation and performs a second read operation on a second word line by using the read offset table. The read offset table stores a plurality of read voltage offsets. Each of the read voltage offsets is set in a unit of a predetermined number of word lines among the plurality of word lines.

According to an exemplary embodiment of the present inventive concept, a method of operating a nonvolatile memory device that includes a three-dimensional (3D) memory cell array is provided as follows. A plurality of read operations including a first read operation is performed on the 3D memory cell array. The first read operation is firstly performed on a first word line using a first read voltage level among the plurality of read operations. A read retry operation using a second read voltage level is performed on the first word line after the first read operation is firstly performed and before a second read operation is secondly performed on a second word line. A third read voltage level is generated based on the first read voltage level and a read offset of the second word line. The second read operation is performed using the third read voltage level.

BRIEF DESCRIPTION OF DRAWINGS

These and other features of the inventive concept will become more apparent by describing in detail exemplary embodiments thereof with reference to the accompanying drawings of which:

FIGS. 10A to 10C are drawings illustrating information about the read offset table group stored in the read offset table storing unit of FIG. 2;

DETAILED DESCRIPTION OF EXEMPLARY EMBODIMENTS

Figure 1:
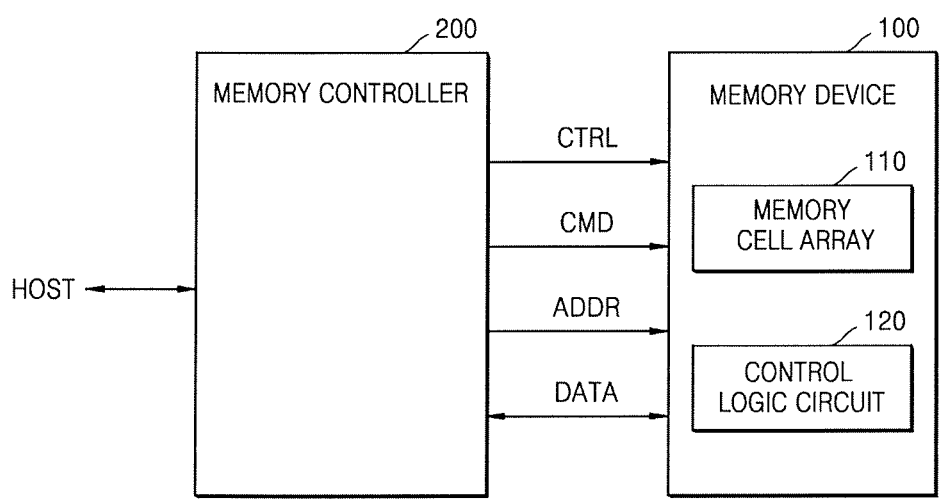
FIG. 1 is a block diagram illustrating a memory system according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a block diagram illustrating a memory system 10 according to an exemplary embodiment of the present inventive concept.

Referring to FIG. 1, the memory system 10 may include a memory device 100 and a memory controller 200, and the memory device 100 may include a memory cell array 110 and a control logic circuit 120. In response to a read/write request from a host, the memory controller 200 may control the memory device 100 to read data stored in the memory device 100 or write data to the memory device 100. For example, the memory controller 200 may provide the memory device 100 with an address ADDR, a command CMD, and a control signal CTRL to control a program (write), read, or erase operation with respect to the memory device 100. Furthermore, data for a program operation and read data may be exchanged between the memory controller 200 and the memory device 100.

The memory cell array 110 may include a plurality of memory cells. For example, each of the plurality of memory cells may be a flash memory cell. Below, in embodiments of the inventive concept, it will be described that each of the plurality of memory cells is a NAND flash memory cell. However, embodiments of the inventive concept are not limited thereto. As another embodiment, each of the plurality of memory cells may be a resistive memory cell such as a resistive random access memory (ReRAM) cell, a phase change RAM (PRAM) cell, or a magnetic RAM (MRAM) cell.

In some embodiments, the memory cell array 110 may include a two-dimensional (2D) memory cell array, which includes a plurality of strings arranged along row and column directions. In some embodiments, the memory cell array 110 may include a three-dimensional (3D) memory cell array, which includes a plurality of NAND strings. Each of the NAND strings may include memory cells that are connected to word lines vertically stacked on a substrate. This will be described with reference to FIGS. 4 and 5.

A 3D memory cell array is monolithically formed in one or more physical levels of arrays of memory cells having an active area disposed above a silicon substrate and circuitry associated with the operation of those memory cells, whether such associated circuitry is above or within such a substrate. The term "monolithic" means that layers of each level of the array are directly deposited on the layers of each underlying level of the array.

In an exemplary embodiment of the inventive concept, the 3D memory cell array includes vertical NAND strings that are vertically oriented such that at least one memory cell is located over another memory cell. The at least one memory cell may comprise a charge trap layer. The following patent documents, which are hereby incorporated by reference, describe configurations for 3D memory cell arrays, in which the 3D memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The control logic circuit 120 may control a read operation with respect to first memory cells, which are connected to a first word line corresponding to a read address, by using a first read voltage level within a read section with respect to the memory cells. Here, the first read voltage level may be a default read voltage level, which is determined based on an initial threshold voltage distribution (e.g., 61 of FIG. 6) of memory cells. When a read operation fails, the control logic circuit 120 may control a read retry operation with respect to the first memory cells, which are connected to the first word line, by using a second read voltage level. Here, the second read voltage level may be a read retry voltage level, which is determined based on a changed threshold voltage distribution (e.g., 62 of FIG. 6) of the memory cells.

When the read retry operation is successful, the second read voltage level may be set as an optimum read voltage level with respect to the first word line. In an exemplary embodiment, the control logic circuit 120 may determine whether the read retry operation is successful or fails, based on data read from the memory cell array 110. When the read retry operation is successful, the control logic circuit 120 may set the second read voltage level as the optimum read voltage level. However, embodiments of the inventive concept are not limited thereto. As another embodiment, the memory controller 200 may determine whether the read retry operation is successful or fails, based on data received from the memory device 100. When the read retry operation is successful, the memory controller 200 may set the second read voltage level as the optimum read voltage level.

The control logic circuit 120 may control a read operation with respect to second memory cells, which are connected to a second word line corresponding to a next read address, by using a read offset table determined according to a difference between the first and second read voltage levels. Here, the read offset table may be a table that stores read voltage offsets respectively corresponding to word lines. Read voltage offsets that respectively correspond to different word lines may be stored differently from each other. Here, a read voltage offset corresponding to the second word line may indicate a difference between a predetermined optimum read voltage level and an optimum read voltage level with respect to the second word line. As such, the control logic circuit 120 may perform a read operation with respect to the second memory cells, which are connected to the second word line, by using an optimum read voltage level that is obtained by compensating for a threshold voltage distribution variation for each word line, for example, a threshold voltage variation for each word line. The read offset table will be described in detail with reference to FIGS. 9 to 13.

According to an embodiment, one of a plurality of read offset tables may be selected based on a difference between the first and second read voltage levels and the first word line. The plurality of read offset tables may be defined at different read environments, respectively. Each of the read environments may include a retention time, a read disturb, or a temperature bump. However, the read environment according to an embodiment need not be limited to the above-described exemplifications. For example, a plurality of read offset tables may be defined through various environment changes in advance.

The retention time may be a time that elapses at a high temperature or a room temperature after memory cells are programmed and may be referred to as a "data retention time". A charge loss of a memory cell may increase as the retention time increases, and charge loss speeds of word lines may be different from each other. For example, electrons that are trapped in a charge storage layer through a program operation may decrease due to a redistribution phenomenon occurring with the lapse of time, for example, various phenomena such as a discharge to a channel area and a shift through the charge storage layer. As such, a threshold voltage of the memory cell may decrease. In this case, drooping and spreading with respect to a threshold voltage distribution of memory cells may occur. Here, threshold voltage increments of word lines may be different from each other.

The read disturb may refer to a phenomenon in which as a read operation is repeatedly performed with respect to memory cells connected to a selected word line, a threshold voltage distribution of memory cells connected to a word line(s) adjacent to the selected word line is changed. For example, as the number of read operations with respect to the memory cells connected to the selected word line increases, threshold voltages of the memory cells connected to the adjacent word line may increase. A threshold voltage increment for each word line may vary according to a distance from the selected word line.

The temperature bump may refer a phenomenon in which a threshold voltage distribution of memory cells is changed according to results of performing a high-temperature program/a high-temperature read operation, a high-temperature program/a low-temperature read operation, a low-temperature program/a high-temperature read operation, and a low-temperature program/a low-temperature read operation. For example, the greater a temperature difference between a program operation and a read operation, the greater a threshold voltage variation of a memory cell. The threshold voltage variations of word lines may be different from each other.

In an exemplary embodiment, the plurality of read offset tables may be previously defined according to the retention time. Even though a retention time of memory cells corresponding to a read address is unknown, a read operation may be performed under the condition that a read voltage offset is applied to other word lines by using a read offset table that is selected based on a difference between the first and second read voltage levels with respect to the first word line. As such, even though the read retry operation is not performed for each word line, it may be possible to compensate for a threshold voltage distribution variation for each word line. This may mean that the performance of the memory device 100 is improved.

In an exemplary embodiment, the control logic circuit 120 may select one of the plurality of read offset tables that are stored in a partial area of the memory cell array 110 or in a register of the control logic circuit 120. The control logic circuit 120 may determine a third read voltage level by applying a read voltage offset, which corresponds to the second word line, of the selected read offset table to the first read voltage level. The control logic circuit 120 may perform a control to apply a read voltage having the determined third read voltage level to the second word line. However, embodiments of the inventive concept are not limited thereto. As another embodiment, the memory controller 200 may select one of the plurality of read offset tables and may provide the memory device 100 with information about a read voltage offset, which corresponds to the second word line, of the selected read offset table.

Figure 2:
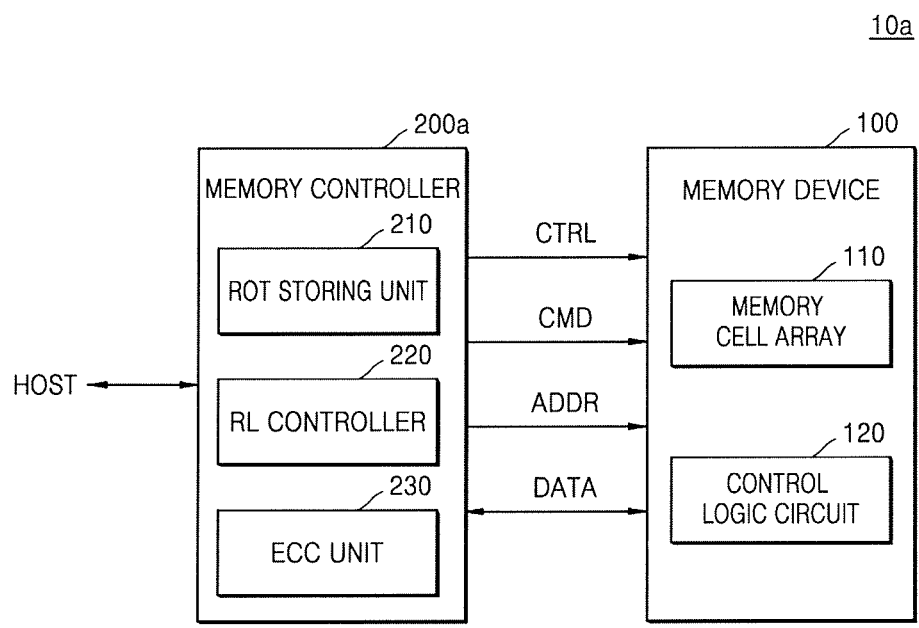
FIG. 2 is a block diagram illustrating a memory system according to an exemplary embodiment of the present inventive concept.

FIG. 2 is a block diagram illustrating a memory system 10a according to an exemplary embodiment of the present inventive concept.

Referring to FIG. 2, the memory system 10a may include the memory device 100 and a memory controller 200a. The memory controller 200a may include a read offset table (ROT) storing unit 210, a read level (RL) controller 220, and an error correction code (ECC) unit 230. The memory system 10a according to an embodiment may correspond to an exemplification of the memory system 10 of FIG. 1. Contents described with reference to FIG. 1 may be applied to an embodiment of FIG. 2, and a duplicated description thereof is omitted.

The read offset table storing unit 210 may store a plurality of read offset table groups, each of which includes a plurality of read offset tables. For example, the read offset table storing unit 210 may be implemented with a partial area of a buffer memory. The read offset table group will be described with reference to FIGS. 10A to 10C, and the read offset tables will be described with reference to FIGS. 11 to 13.

The read level controller 220 may control a read voltage, which is to be applied to the first word line corresponding to the first address received from the memory controller 200, so as to have the first read voltage level. Here, the first read voltage level may be an optimum read voltage level that is determined based on an initial threshold voltage distribution of memory cells. When a read operation performed by using the first read voltage level fails, the read level controller 220 may control a read voltage, which is to be applied to the first word line, so as to have the second read voltage level. When a read operation performed by using the second read voltage level is successful, the read level controller 220 may set the second read voltage level as an optimum read voltage level.

The read level controller 220 may select one of the plurality of offset tables, which are stored in the read offset table storing unit 210, based on a difference between the first and second read voltage levels. Afterwards, the read level controller 220 may obtain a read voltage offset, which corresponds to the second word line corresponding to the second address received from the memory controller 200, from the selected read offset table.

In an exemplary embodiment, the read level controller 220 may send information about the read voltage offset to the memory device 100 together with a read command and the second address. For example, the information about the read voltage offset may be provided as a control signal CTRL to the memory device 100. As such, the memory device 100 may obtain a third read voltage level by applying a corresponding read voltage offset to the first read voltage level. For example, the third read voltage level may be obtained by adding the read voltage offset to the first read voltage level. The control logic circuit 120 may perform a control to apply the third read voltage level to the second word line. For example, a read operation with respect to memory cells connected to the second word line may be performed.

In an exemplary embodiment, the read level controller 220 may obtain the third read voltage level by applying the read voltage offset to the first read voltage level. The read level controller 220 may send information about the third read voltage level to the memory device 100 together with the read command and the second address. For example, the information about the third read voltage level may be provided as the control signal CTRL to the memory device 100. As such, the control logic circuit 120 of the memory device 100 may perform a control to apply the third read voltage level to the second word line corresponding to the second address. For example, a read operation with respect to memory cells connected to the second word line may be performed.

The ECC unit 230 may perform an error correction operation with respect to data received from the memory device 100. For example, the ECC unit 230 may perform an ECC encoding process and an ECC decoding process by using algorithm such as a Reed solomon (RS) code, a hamming code, or a cyclic redundancy check (CRC) code. Here, the ECC encoding process may include generating a parity bit based on data to be programmed, and the ECC decoding process may include detecting an error bit(s) from data read from the memory device 100 and correcting the detected error bit(s). For example, the ECC unit 230 may compare a parity bit, which is generated and stored in programming data, with a parity bit(s), which is generated in reading data, and may detect an error bit(s) based on the comparison result. The ECC unit 230 may correct the error bit by performing a logical operation (e.g., an exclusive OR (XOR) operation) with respect to the detected error bit(s).

Figure 3:
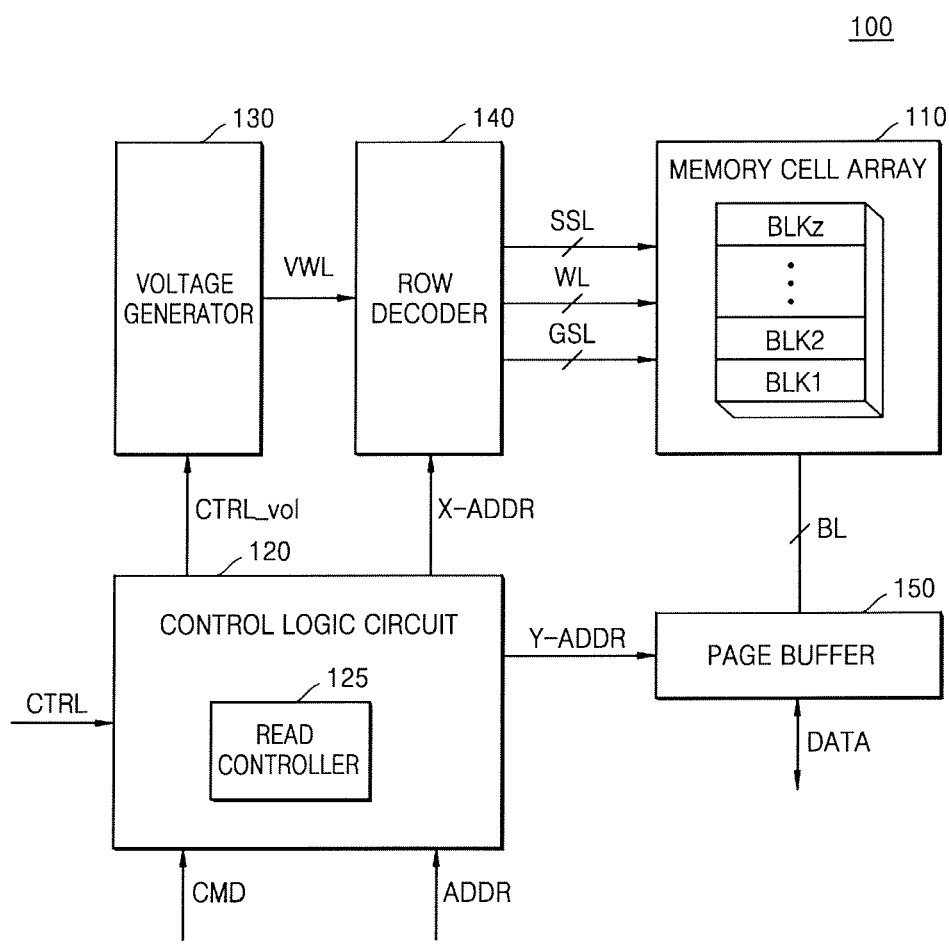
FIG. 3 is a block diagram illustrating a memory device according to an exemplary embodiment of the present inventive concept.

FIG. 3 is a block diagram illustrating the memory device 100 according to an exemplary embodiment of the present inventive concept.

Referring to FIG. 3, the memory device 100 may include the memory cell array 110, the control logic circuit 120, a voltage generator 130, a row decoder 140, and a page buffer 150. The memory cell array 110 according to an embodiment may be an example of the memory cell array 110 of FIGS. 1 and 2, and the control logic circuit 120 may be an example of the control logic circuit 120 of FIGS. 1 and 2. However, a configuration of the memory device 100 need not be limited to that of FIG. 3. For example, the memory device 100 may further include other elements such as a data input/output unit.

The memory cell array 110 may include a plurality of memory cells and may be connected to word lines WL and bit lines BL. For example, the memory cell array 110 may be connected to the row decoder 140 through the word lines WL, string selection lines SSL, and ground selection lines GSL and may be connected to the page buffer 150 through the bit lines BL. Each memory cell may store one or more bits. For example, each memory cell may be used as a single level cell, a multi-level cell, or a triple level cell. In an exemplary embodiment, a part of a plurality of memory blocks BLK1 to BLKz included in the memory cell array 110 may be used as single level cell blocks, and the others may be used as multi-level cell blocks or triple level cell blocks. A detailed configuration of the memory cell array 110 will be described with reference to FIGS. 4 and 5.

The control logic circuit 120 may output various control signals for writing data to the memory cell array 110, reading data from the memory cell array 110, or erasing data stored in the memory cell array 110, based on the command CMD, the address ADDR, and the control signal CTRL received from the memory controller 200. For example, the control logic circuit 120 may control various kinds of operations of the memory device 100 overall.

The various control signals output from the control logic circuit 120 may be provided to the voltage generator 130, the row decoder 140, and the page buffer 150. For example, the control logic circuit 120 may provide a voltage control signal CTRL_vol to the voltage generator 130, a row address X-ADDR to the row decoder 140, and a column address Y-ADDR to the page buffer 150. However, embodiments of the inventive concept are not limited thereto. For example, the control logic circuit 120 may further provide other control signals to the voltage generator 130, the row decoder 140, and the page buffer 150.

In an exemplary embodiment, the control logic circuit 120 may include a read controller 125. During a read operation, the read controller 125 may control the voltage generator 130 and the row decoder 140 such that a read voltage that has the first read voltage level corresponding to a default level is applied to a selected word line. Furthermore, when a read operation fails, the read controller 125 may control the read retry operation for determining an optimum read voltage level with respect to selected memory cells.

For example, the read controller 125 may control the voltage generator 130 and the row decoder 140 such that the read voltage that has the second read voltage level different from the first read voltage level is applied to the selected word line. In an exemplary embodiment, when the read operation is successful, the read level controller 220 may set the second read voltage level as the optimum read voltage level. An operation of the read controller 125 need not be limited to this disclosure. For example, the read controller 125 may perform the read retry operation by using various ways to determine the optimum read voltage level with respect to the selected memory cells. The following patent documents, which are hereby incorporated by reference, describe the read retry operation: US Pat. Pub. Nos. 2015/0029796 and 2014/0022853 and U.S. Pat. No. 9,036,412.

The read controller 125 may control a read operation corresponding to a next address by using a read offset table, which is selected based on a difference between the first and second read voltage levels, from among the plurality of read offset tables defined in advance. For example, during the read operation with respect to the next address, the read controller 125 may control the voltage generator 130 and the row decoder 140 such that a read voltage that has the third read voltage level obtained by applying a read voltage offset to the first read voltage level is applied to a selected word line.

The voltage generator 130 may generate various kinds of voltages for performing a program, a read, and an erase operation with respect to the memory cell array 110, based on the voltage control signal CTRL_vol. For example, the voltage generator 130 may generate a word line driving voltage VWL for driving the word lines WL, for example, a program voltage (or a write voltage), a read voltage, a program inhibit voltage, a read inhibit voltage, an erase verify voltage, or a program verify voltage. Furthermore, the voltage generator 130 may further generate a string selection line driving voltage for driving the string selection lines SSL and a ground selection line driving voltage for driving the ground selection line GSL. The voltage generator 130 may further generate an erase voltage to be provided to the memory cell array 110.

The row decoder 140 may select a part of the word lines WL in response to the row address X-ADDR received from the control logic circuit 120. For example, during the read operation, the row decoder circuit 140 may apply the read voltage to the selected word line and the read inhibit voltage to unselected word lines. Furthermore, during a program operation, the row decoder circuit 140 may apply the program voltage to the selected word line and the program inhibit voltage to the unselected word lines. Furthermore, the row decoder 140 may select a part of the string selection lines SSL or a part of the ground selection line GSL in response to the row address X-ADDR received from the control logic circuit 120.

The page buffer 150 may be connected to the memory cell array 110 through the bit lines BL and may select a part of the bit lines BL in response to the column address Y-ADDR received from the control logic circuit 120. For example, during the read operation, the page buffer 150 may operate as a sense amplifier and may sense data stored in the memory cell array 110. Meanwhile, during the program operation, the page buffer 150 may operate as a write driver and may store data to be written to the memory cell array 110.

Figure 4:
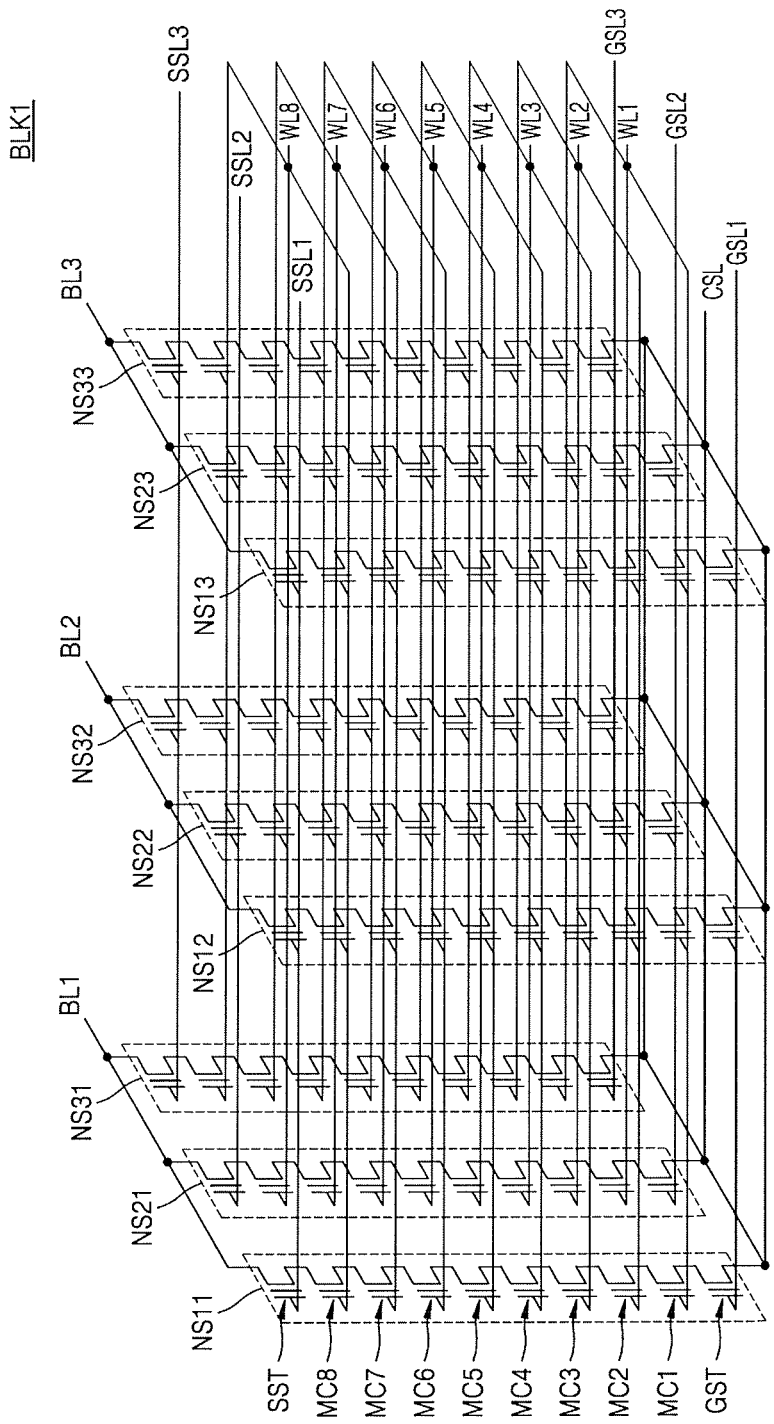
FIG. 4 is a circuit diagram illustrating an example of a memory block included in the memory cell array of FIG. 3.

FIG. 4 is a circuit diagram illustrating an example of the memory block BLK1 included in the memory cell array 110 of FIG. 3.

Referring to FIG. 4, the memory cell array 110 may be a memory cell array of a vertical NAND flash memory and may include a plurality of memory blocks. The memory block BLK1 may include a plurality of NAND strings NS11 to NS33, a plurality of word lines WL1 to WL8, a plurality of bit lines BL1 to BL3, a plurality of ground selection line GSL1 to GSL3, a plurality of string selection lines SSL1 to SSL3, and a common source line CSL. Here, the number of NAND strings, the number of word lines, the number of bit lines, the number of ground selection lines, and the number of string selection lines may be variously changed according to embodiments.

The NAND strings NS11, NS21, and NS31 may be provided between the first bit line BL1 and the common source line CSL, the NAND strings NS12, NS22, and NS32 may be provided between the second bit line BL2 and the common source line CSL, and the NAND strings NS13, NS23, and NS33 may be provided between the third bit line BL3 and the common source line CSL. Each NAND string (e.g., NS11) may include a string selection transistor SST, a plurality of memory cells MC1 to MC8 and a ground selection transistor GST that are connected in series. Hereinafter, for the convenience of descriptions, the NAND string may be referred to as a "string".

Strings that are connected in common to a bit line may constitute a column. For example, the strings NS11, NS21, and NS31 connected in common to the first bit line BL1 may correspond to a first column, the strings NS12, NS22, and NS32 connected in common to the second bit line BL2 may correspond to a second column, and the strings NS13, NS23, and NS33 connected in common to the third bit line BL3 may correspond to a third column.

Strings that are connected in common to a string selection line may constitute a row. For example, the strings NS11, NS12, and NS13 connected in common to the first string selection line SSL1 may correspond to a first row, the strings NS21, NS22, and NS23 connected in common to the second string selection line SSL2 may correspond to a second row, and the strings NS31, NS32, and NS33 connected in common to the third string selection line SSL3 may correspond to a third row.

In each string, the string selection transistors SST may be connected with a corresponding string selection line SSL1, SSL2, or SSL3. The plurality of memory cells MC1 to MC8 may be connected to corresponding word lines WL1 to WL8, respectively. In each string, the ground selection transistor GST may be connected to a corresponding ground selection line GSL1, GSL2, or GSL3. In each string, the string selection transistor SST may be connected to a corresponding bit line BL1, BL2, or BL3, and the ground selection transistor GST may be connected to the common source line CSL.

In an exemplary embodiment, word lines (e.g., WL1) of the same height may be connected in common to each other, the string selection lines SSL1 to SSL3 may be separated from each other, and the ground selection lines GSL1 to GSL3 may be separated from each other. For example, the first word line WL1 and the first string selection line SSL1 may be selected in programming memory cells that are connected to the first word line WL1 and belong to the strings NS11, NS12, and NS13. However, embodiments of the inventive concept are not limited thereto. As another embodiment, the ground selection lines GSL1 to GSL3 may be connected in common to each other.

Figure 5:
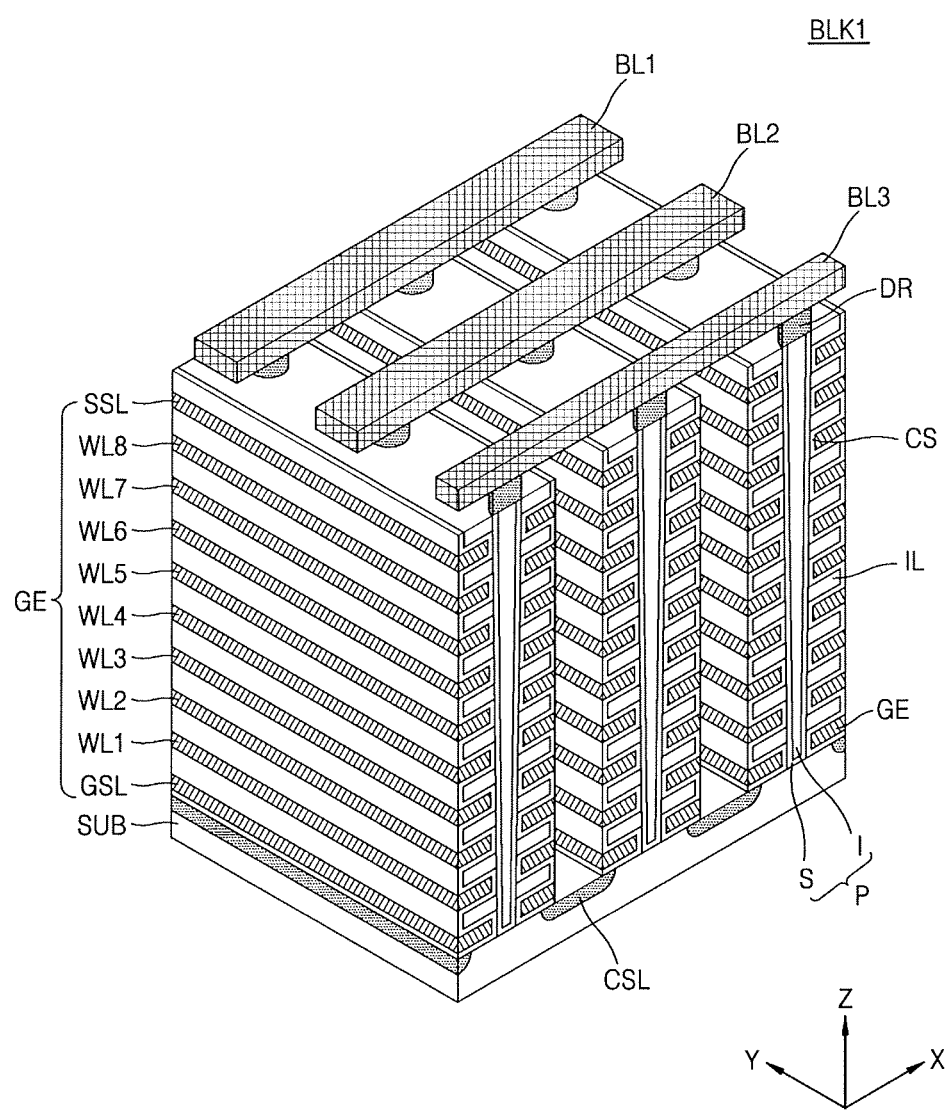
FIG. 5 is a perspective view of the memory block of FIG. 4.

FIG. 5 is a perspective view of the memory block BLK1 of FIG. 4.

Referring to FIG. 5, each memory block included in the memory cell array 110 may be formed in a direction perpendicular to a substrate SUB. In FIG. 5, for the convenience of a description, the memory block BLK1 includes two selection lines GSL and SSL, eight word lines WL1 to WL8, and three bit lines BL1 to BL3. However, the present inventive concept is not limited thereto. For example, the number of lines included in the memory block BLK1 may be more or less than that illustrated in FIG. 5.

The substrate SUB may be of a first conductivity type (e.g., a p-type), and the common source line CSL that is doped with dopants (or impurities) of a second conductivity type (e.g., an n-type) and extends along a first direction (e.g., a Y-direction) may be formed on the substrate SUB. A plurality of insulating layers IL that extend along the first direction may be provided sequentially along a third direction (e.g., a Z-direction) on a substrate area between two adjacent common source lines CSL. The plurality of insulating layers IL may be spaced from each other by a distance along the third direction. For example, each of the plurality of insulating layers IL may include an insulating material such as silicon oxide.

A plurality of pillars "P" that is sequentially arranged along the first direction and penetrates the plurality of insulating layers IL along the third direction may be provided on a substrate area between two adjacent common source lines CSL. For example, the plurality of pillars "P" may make contact with the substrate SUB through the plurality of insulating layers IL. For example, a surface layer "S" of each pillar "P" may include a silicon material doped with dopants of the first conductivity type and may function as a channel area. Meanwhile, an inner layer "I" of each pillar "P" may include an insulating material such as silicon oxide or an air gap.

In an area between two adjacent common source lines CSL, a charge storage layer CS may be provided along exposed surfaces of the insulating layers IL, the pillars "P", and the substrate SUB. The charge storage layer CS may include a gate insulating layer (or referred as "tunneling insulating layer"), a charge trap layer, and a blocking insulating layer. For example, the charge storage layer CS may have an oxide-nitride-oxide (ONO) structure. Furthermore, in an area between two adjacent common source lines CSL, gate electrodes GE such as the selection lines GSL and SSL and the word lines WL1 to WL8 may be provided on an exposed surface of the charge storage layer CS.

Drains or drain contacts DR may be provided on the plurality of pillars "P", respectively. For example, each of the drains or drain contacts DR may include a silicon material which is doped with dopants of the second conductivity type. The bit lines BL1 to BL3 that extend in a second direction (e.g., an X-direction) and are spaced from each other by a distance may be provided on the drains DR.

Figure 6:
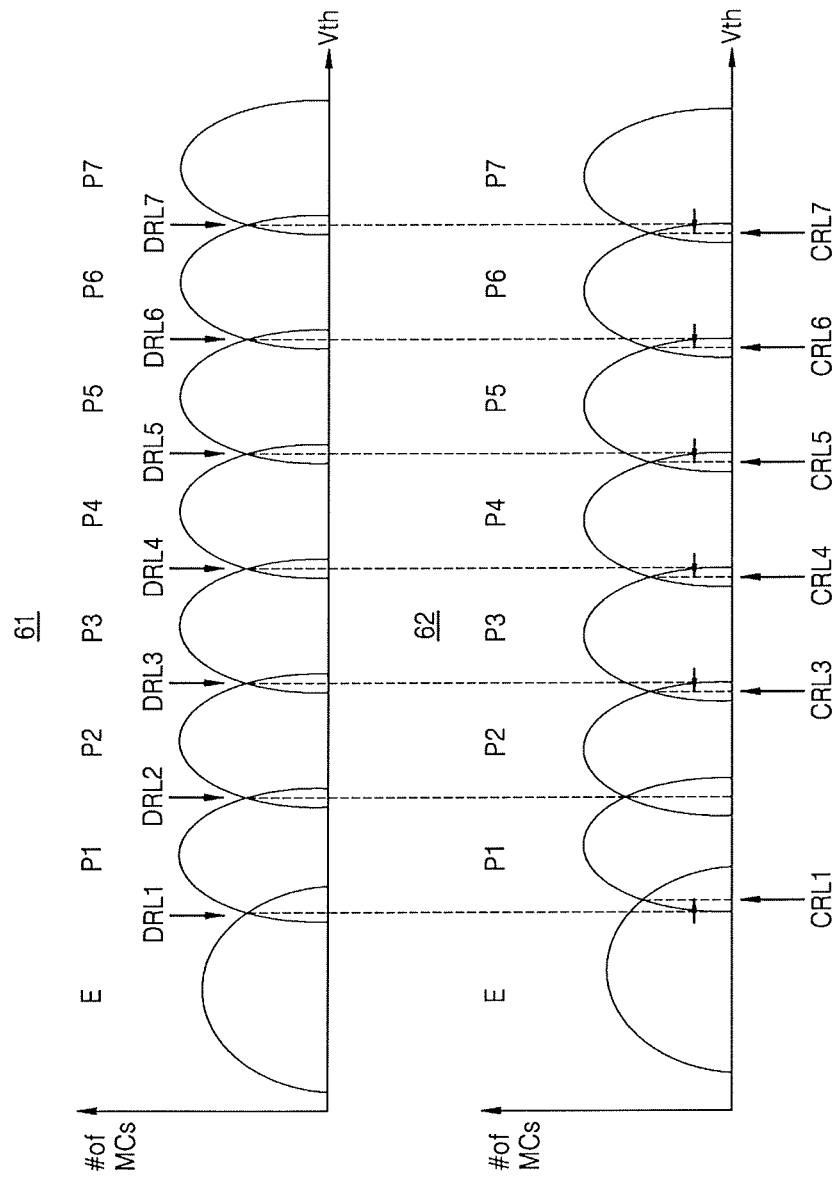
FIG. 6 shows graphs illustrating an initial threshold voltage distribution and a changed threshold voltage distribution of memory cells included in the memory cell array of FIG. 3.

FIG. 6 shows graphs illustrating an initial threshold voltage distribution 61 and a changed threshold voltage distribution 62 of memory cells included in the memory cell array 110 of FIG. 3.

Referring to FIG. 6, in the initial threshold voltage distribution 61 and the changed threshold voltage distribution 62, the abscissa represents a threshold voltage Vth, and the ordinate represents the number of memory cells (MCs). Each of the initial threshold voltage distribution 61 and the changed threshold voltage distribution 62 may indicate a threshold voltage distribution formed according to threshold voltages Vth of memory cells. For example, when a memory cell is a triple level cell in which three bits are programmed, the memory cell may have one of an erase state E and first to seventh program states P1 to P7.

The initial threshold voltage distribution 61 may be a threshold voltage distribution of memory cells just after a program operation with respect to the memory cells or within a predetermined time after the program operation is completed. Each of a plurality of default read voltage levels DRL1 to DRL7 that correspond to the plurality of program states P1 to P7 respectively may be determined based on a valley between two adjacent states. For example, the first default read voltage level DRL1 may be determined based on a valley between the erase state E and the first program state P1. Furthermore, the seventh default read voltage level DRL7 may be determined based on a valley between the sixth program state P6 and the seventh program state P7.

The changed threshold voltage distribution 62 may be a threshold voltage distribution of memory cells after the program operation with respect to the memory cells is completed and the predetermined time elapses. Threshold voltages of memory cells that form the initial threshold voltage distribution 61 and are programmed to the erase state E and the first to seventh program states P1 to P7 may be changed by an external stimulus or wear-out so that they form the changed threshold voltage distribution 62. For example, when a time elapses after the program operation is performed, that is, when a retention time increases, charges stored in the charge storage layer (e.g., CS of FIG. 5) of the memory cell may be discharged (or leaked) to the substrate SUB, and thus threshold voltages of memory cells may decrease. For example, the threshold voltages of the memory cells may increase due to the read disturb that is generated as a read operation with respect to adjacent memory cells is performed. For example, the threshold voltages of the memory cells may be changed due to a temperature difference between a program operation and a read operation.

For example, threshold voltages of memory cells programmed to the erase state E and the first program state P1 may increase, and thus a valley between the erase state E and the first program state P1 may be shifted in a positive direction. Accordingly, when a read operation is performed by using the first default read voltage level DRL1, a read error may be generated from a part of memory cells programmed to the erase state E. Here, the read error may correspond to the case that the number of fail bits of read data is more than or equal to a reference value that corresponds to the number of fail bits correctable with an ECC. In this case, an optimum read voltage level with respect to the first program state P1 may be changed to a first corrected read voltage level CRL1 corresponding to a shifted valley between the erase state E and the first program state P1, thereby making it possible to correct the read error.

For example, threshold voltages of memory cells programmed to the sixth and seventh program states P6 and P7 may decrease, and thus a valley between the sixth and seventh program states P6 and P7 may be shifted in a negative direction. Accordingly, when a read operation is performed by using the seventh default read voltage level DRL7, a read error may be generated from a part of memory cells programmed to the seventh program state P7. Here, the read error may correspond to the case that the number of fail bits of read data is more than or equal to the reference value that corresponds to the number of fail bits correctable with the ECC. In this case, an optimum read voltage level with respect to the seventh program state P7 may be changed to have a seventh corrected read voltage level CRL7 corresponding to a shifted valley between the sixth and seventh program states P6 and P7, thereby making it possible to correct the read error.

Figure 7A:
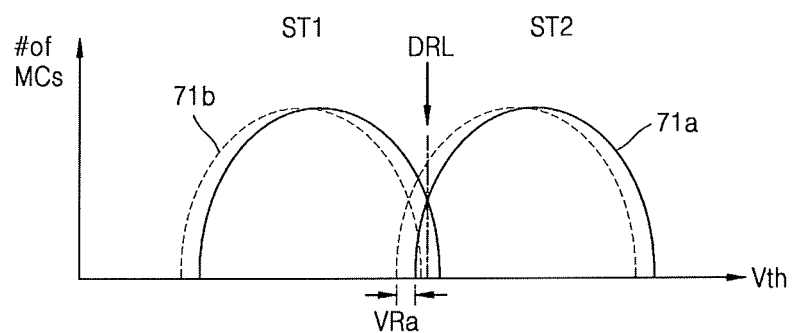
FIG. 7A is a graph indicating a part of a threshold voltage distribution of memory cells corresponding to a first word line of FIG. 4, according to an exemplary embodiment of the present inventive concept.
Figure 7B:
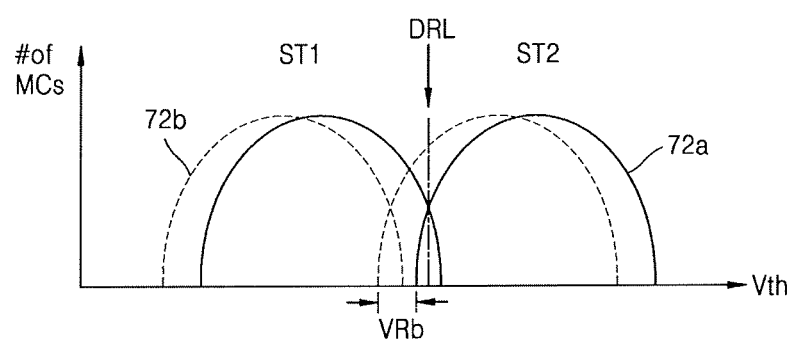
FIG. 7B is a graph indicating a part of a threshold voltage distribution of memory cells corresponding to a second word line of FIG. 4, according to an exemplary embodiment of the present inventive concept.

FIG. 7A is a graph indicating a part of a threshold voltage distribution of memory cells corresponding to the first word line WL1 of FIG. 4, according to an embodiment. FIG. 7B is a graph indicating a part of a threshold voltage distribution of memory cells corresponding to the second word line WL2 of FIG. 4, according to an embodiment.

Referring to FIGS. 7A and 7B, the abscissa represents a threshold voltage Vth, and the ordinate represents the number of memory cells. For example, when a memory cell is a triple level cell, first and second states ST1 and ST2 may correspond to two adjacent states of the erase state E and the first to seventh program states P1 to P7, respectively. For example, when a memory cell is a multi-level cell, the first and second states ST1 and ST2 may correspond to two adjacent states of an erase state and first to third program states P1 to P3, respectively. For example, when a memory cell is a single level cell, the first and second states ST1 and ST2 may correspond to an erase state and a program state, respectively.

In FIG. 7A, an initial threshold voltage distribution 71a indicates an initial threshold voltage distribution of memory cells connected to the first word line WL1, and a changed threshold voltage distribution 71b indicates a changed threshold voltage distribution of the memory cells connected to the first word line WL1. A read voltage with respect to the memory cells connected to the first word line WL1 may be determined based on the initial threshold voltage distribution 71a to have a default read voltage level DRL. In the changed threshold voltage distribution 71b, threshold voltages of memory cells programmed to the first and second states ST1 and ST2 may be shifted by a first variation VRa in a negative direction.

In FIG. 7B, an initial threshold voltage distribution 72a indicates an initial threshold voltage distribution of memory cells connected to the second word line WL2, and a changed threshold voltage distribution 72b indicates a changed threshold voltage distribution of the memory cells connected to the second word line WL2. A read voltage with respect to the memory cells connected to the second word line WL2 may be determined based on the initial threshold voltage distribution 72a to have a default read voltage level DRL. In the changed threshold voltage distribution 72b, threshold voltages of memory cells programmed to the first and second states ST1 and ST2 may be shifted by a second variation VRb in the negative direction.

Since the initial threshold voltage distribution 71a of the memory cells connected to the first word line WL1 is substantially the same as the initial threshold voltage distribution 72a of the memory cells connected to the second word line WL2, the default read voltage level DRL of FIG. 7A may be the same as that of FIG. 7B. Meanwhile, the changed threshold voltage distribution 71b of the memory cells connected to the first word line WL1 may be different from the changed threshold voltage distribution 72b of the memory cells connected to the second word line WL2. For example, the second variation VRb may be greater than the first variation VRa.

The difference in the threshold voltage variations of the memory cells connected to word lines WL1 and WL2, for example, may result from a difference between charge loss speeds of the memory cells. For example, a charge loss speed of the memory cells connected to the first word line WL1 may be slower than that of the memory cells connected to the second word line WL2. Accordingly, when read operations with respect to the memory cells connected to the first and second word lines WL1 and WL2 are performed by using the same default read voltage level DRL, the number of fail bits of data read from the memory cells connected to the first word line WL1 may be different from the number of fail bits of data read from the memory cells connected to the second word line WL2. For example, since the second variation VRb is greater than the first variation VRa, the number of fail bits of data read from the memory cells connected to the second word line WL2 may be more than the number of fail bits of data read from the memory cells connected to the first word line WL1.

Figure 8:
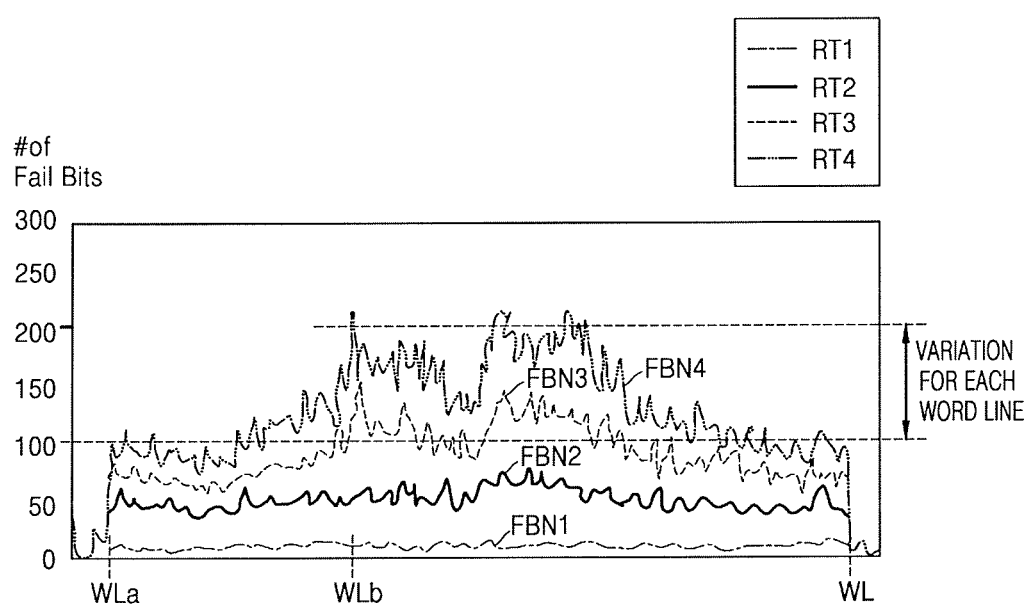
FIG. 8 is a graph illustrating fail bit variations for respective word lines that are respectively measured at different retention times with respect to a second state of FIGS. 7A and 7B.

FIG. 8 is a graph illustrating fail bit variations for respective word lines that are respectively measured at different retention times with respect to the second state ST2 of FIGS. 7A and 7B.

Referring to FIG. 8, the abscissa represents a word line, and the ordinate represents the number of fail bits (hereinafter referred to as a "fail bit number FBN"). Here, the fail bit number FBN may indicate the number of fail bits of data that is read from memory cells connected to each word line. For example, the fail bit number FBN may indicate the number of fail bits of data that is read from memory cells, which are connected to each word line, by using the default read voltage level DRL of FIGS. 7A and 7B.

Each of first to fourth fail bit numbers FBN1 to FBN4 may indicate the number of fail bits of data read from memory cells connected to each word line at a point in time when a program operation is completed and each of first to fourth retention times RT1 to RT4 elapses. For example, the first retention time RT1 may be about 0.1 hour, the second retention time RT2 may be about 12 hours, the third retention time RT3 may be about 24 hours, and the fourth retention time RT4 may be about 36 hours.

According to the first fail bit number FBN1, a difference between fail bit numbers of different word lines may scarcely exist. For example, the fail bit number corresponding to the first word lines WLa may be substantially similar to that corresponding to the second word line WLb. According to the second fail bit number FBN2, a difference between fail bit numbers of different word lines need not be great. For example, each of the fail bit number corresponding to the first word lines WLa and the fail bit number corresponding to the second word line WLb may be approximately 50. That is, the fail bit numbers associated with the first and second word lines WLa and WLb may be substantially similar to each other.

According to the third fail bit number FBN3, a difference between fail bit numbers of different word lines may be very great. For example, the fail bit number corresponding to the first word line WLa may be approximately 75, and the fail bit number corresponding to the second word line WLb may be approximately 100. Accordingly, a difference between fail bit numbers of the first and second word lines WLa and WLb, that is, a fail bit variation for each word line may be approximately 50.

According to the fourth fail bit number FBN4, a difference between fail bit numbers of different word lines may be very great. For example, the fail bit number corresponding to the first word line WLa may be approximately 100, and the fail bit number corresponding to the second word line WLb may be approximately 220. Accordingly, a difference between fail bit numbers of the first and second word lines WLa and WLb, that is, a fail bit variation for each word line may be approximately 120.

As such, as the retention time increases, the variation in a fail bit number for each word line may become great, for example, a threshold voltage variation for each word line may become great. For this reason, as the retention time increases, optimum read voltage levels of word lines may be different from each other. Accordingly, the performance of the memory device 100 may be lowered when the read retry operation for determining the optimum read voltage level is performed for each word line.

Figure 9:
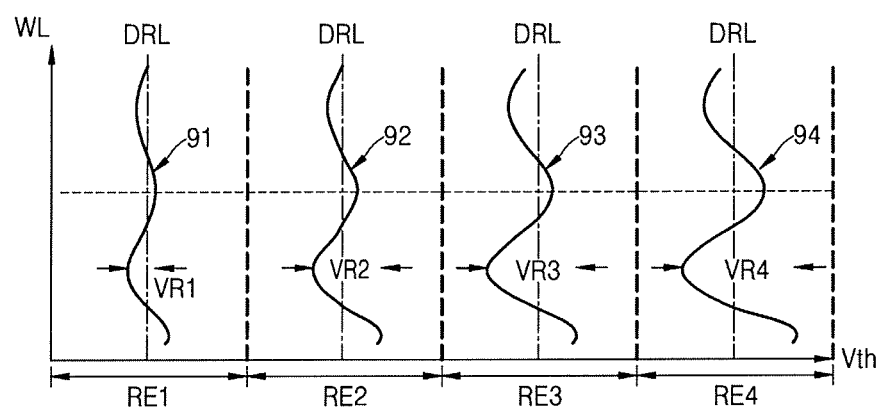
FIG. 9 is a graph illustrating threshold voltage distribution variations for respective word lines that are respectively measured at different read environments with respect to the second state of FIGS. 7A and 7B.

FIG. 9 is a graph illustrating threshold voltage distribution variations for respective word lines that are respectively measured at different read environments with respect to the second state ST2 of FIGS. 7A and 7B.

Referring to FIG. 9, the abscissa represents a threshold voltage Vth, and the ordinate represents a word line. First to fourth curves 91 to 94 indicate lower limits of the second state ST2 that are measured when a read operation is performed at first to fourth read environments RE1 to RE4, respectively. Here, the read environment may include the retention time, the read disturb, or the temperature bump. For example, the first read environment RE1 may include the retention time of one month, the second read environment RE2 may include the retention time of three months, the third read environment RE3 may include the retention time of six months, and the fourth read environment RE4 may include the retention time of one year.

Referring to the first curve 91, in the first read environment RE1, lower limits of the second state ST2 may be different from each other, and a threshold voltage distribution variation VR1 of the first word line may be, for example, approximately 0.2 V. Referring to the second curve 92, in the second read environment RE2, lower limits of the second state ST2 may be different from each other, and a threshold voltage distribution variation VR2 of the second word line may be, for example, approximately 0.3 V. Referring to the third curve 93, in the third read environment RE3, lower limits of the second state ST2 may be different from each other, and a threshold voltage distribution variation VR3 of the third word line may be, for example, approximately 0.3 V. Referring to the fourth curve 94, in the fourth read environment RE4, lower limits of the second state ST2 may be different from each other, and a threshold voltage distribution variation VR4 of the fourth word line may be, for example, approximately 0.35 V.

As such, when the read environments RE1 to RE4 are different from each other, the threshold voltage distribution variations VR1 to VR4 of the first to fourth word lines may be different from each other. When a read operation with respect to memory cells connected to word lines WL is performed by using the default read voltage level DRL, since a difference between fail bit numbers of word lines is great, whether a read operation is successful or fails may differ for each word line.

FIGS. 10A to 10C are drawings illustrating information about the read offset table group stored in the read offset table storing unit 210 of FIG. 2.

Referring to FIG. 10A, the read offset table storing unit 210 may store a read offset table group for each memory block ROT-BLK. For example, the read offset table storing unit 210 may store read offset table groups ROT1 to ROTz that correspond to the plurality of memory blocks BLK1 to BLKz, respectively. For example, when an address received from the memory controller 200 or 200a corresponds to the first memory block BLK1, a read offset table may be selected from the first read offset table group ROT1. However, embodiments of the inventive concept are not limited thereto. For example, the plurality of memory blocks BLK1 to BLKz may be classified into memory block groups, and the read offset table storing unit 210 may store read offset table groups that correspond to the memory block groups, respectively.

Referring to FIG. 10B, the read offset table storing unit 210 may store a read offset table group for each mat ROT-MAT. Here, a mat may refer to a unit of a manufacturing process and may be defined by a well area that is formed on a substrate. For example, one mat may correspond to one page buffer. For example, the read offset table storing unit 210 may store read offset table groups ROT1 to ROTk that correspond to the plurality of mats MAT1 to MATk, respectively. For example, when an address received from the memory controller 200 or 200a corresponds to a first mat MAT1, a read offset table may be selected from the first read offset table group ROT1. However, embodiments of the inventive concept are not limited thereto. For example, the plurality of mats MAT1 to MATk may be classified into mat groups, and the read offset table storing unit 210 may store read offset table groups that correspond to the mat groups, respectively.

Referring to FIG. 10C, the read offset table storing unit 210 may store a read offset table group for each chip ROT-CHIP. For example, the read offset table storing unit 210 may store read offset table groups ROT1 to ROTm that correspond to the plurality of chips CHIP1 to CHIPm, respectively. For example, when an address received from the memory controller 200 or 200a corresponds to a first chip CHIP1, a read offset table may be selected from the first read offset table group ROT1. However, embodiments of the inventive concept are not limited thereto. For example, the plurality of chips CHIP1 to CHIPm may be classified into chip groups, and the read offset table storing unit 210 may store read offset table groups that correspond to the chip groups, respectively.

Figure 11:
FIG. 11 is a drawing illustrating a read offset table group according to an exemplary embodiment of the present inventive concept.

FIG. 11 is a drawing illustrating a read offset table group ROTa according to an embodiment.

Referring to FIG. 11, the read offset table group ROTa may correspond to the first read offset table group ROT1 of FIGS. 10A to 10C, for example. The read offset table group ROTa may include a plurality of read offset tables TABLE1 to TABLE4, each of which includes a plurality of read voltage offsets corresponding to a plurality of word lines WL0 to WL31, respectively. However, embodiments of the inventive concept are not limited thereto. For example, the read offset table group ROTa may include 5 or more read offset tables or may include 3 or less read offset tables.

The first read offset table TABLE1 may include read voltage offsets V1a to V1f that correspond to the word lines WL0 to WL31, respectively. Read voltage offsets that correspond to, respectively, different word lines may be different from each other. However, read voltage offsets that correspond to, respectively, arbitrary word lines may be the same as each other. For example, the first read offset table TABLE1 may be defined at the first read environment (e.g., RE1 of FIG. 9), the second read offset table TABLE2 may be defined at the second read environment (e.g., RE2 of FIG. 9), the third read offset table TABLE3 may be defined at the third read environment (e.g., RE3 of FIG. 9), and the fourth read offset table TABLE4 may be defined at the fourth read environment (e.g., RE4 of FIG. 9). In an exemplary embodiment, one of the read environments RE1 to RE4 may be selected by detecting a difference between a first read voltage level and a second read voltage level which will be described later with respect to FIGS. 14, 17 and 18. In an exemplary embodiment, the first read voltage level may be a default read voltage level and the second read voltage may be an optimum read voltage level of a read retry operation.

In an exemplary embodiment, read voltage offsets stored in the read offset table group ROTa may be determined based on a channel hole size. For example, as the channel hole size becomes large, the charge loss speed may be slow. Read offsets may be defined for respective word lines to compensate for a variation in a threshold voltage distribution according to the channel hole size.

Figure 12A:
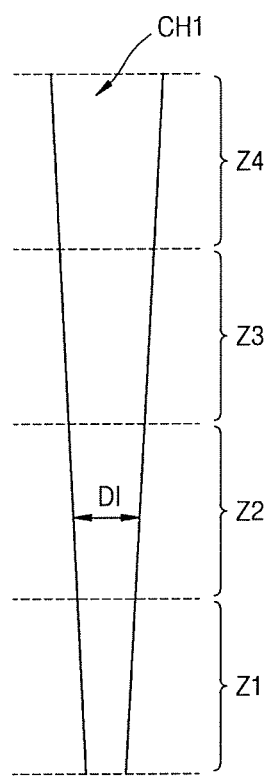
FIGS. 12A and 12B are drawings illustrating an example in which a NAND string is divided into a plurality of groups, according to an exemplary embodiment of the present inventive concept.
Figure 12B:
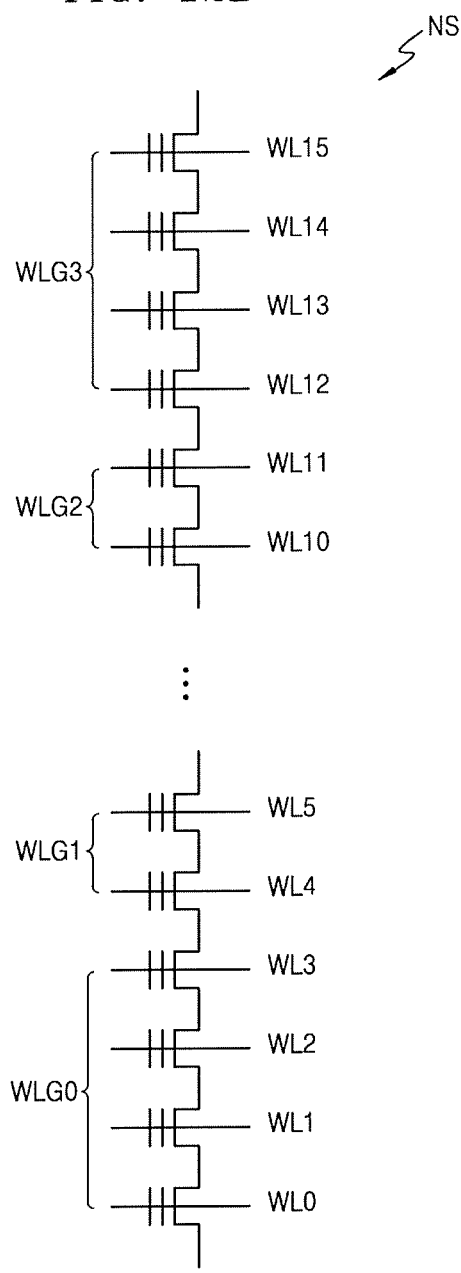

FIGS. 12A and 12B are drawings illustrating an example in which a NAND string NS is divided into a plurality of groups, according to an exemplary embodiment of the present inventive concept.

A channel hole CH1 that corresponds to one string included in a 3D memory cell array (e.g., 110 of FIG. 3) is illustrated in FIG. 12A. Since the channel hole CH1 is formed by etching a part of gate electrodes and insulating layers stacked on a substrate, etching may be poorly made as a depth from a surface increases. As such, a diameter of the channel hole CH1 may become small as a distance from the substrate SUB decreases.

In an exemplary embodiment, the channel hole CH1 may be divided into four zones based on a channel hole diameter DI. For example, a zone in which a channel hole diameter is smaller than approximately 40 nm may be determined as a first zone Z1, a zone in which a channel hole diameter is greater than or equal to approximately 40 nm and smaller than approximately 60 nm may be determined as a second zone Z2, a zone in which a channel hole diameter is greater than or equal to approximately 60 nm and smaller than approximately 80 nm may be determined as a third zone Z3, and a zone in which a channel hole diameter is greater than or equal to approximately 80 nm and smaller than approximately 100 nm may be determined as a fourth zone Z4.

Referring to FIG. 12B, the NAND string NS may include a plurality of word lines WL0 to WL15 and may be divided into a plurality of word line groups. For example, the plurality of word line groups may be determined based on distances to word lines from the substrate.

In an exemplary embodiment, each word line group may be positioned at a predetermined distance range from the substrate. For example, a first word line group WLG0 may include lower word lines WL0 to WL3 adjacent to the substrate and may correspond to the first zone Z1 of FIG. 12A. A second word line group WLG2 may include word lines WL4 and WL5 and may correspond to the second zone Z2 of FIG. 12A. A third word line group WLG2 may include word lines WL10 and WL11 and may correspond to the third zone Z3 of FIG. 12A. A fourth word line group WLG3 may include word lines WL12 to WL15 and may correspond to the fourth zone Z4 of FIG. 12A. However, embodiments of the inventive concept are not limited thereto. For example, the NAND string may include word lines of which the number is more or less than 16 and may be divided into word line groups of which the number is more or less than 4.

Figure 13:
FIG. 13 is a drawing illustrating a read offset table group according to an exemplary embodiment of the present inventive concept.

FIG. 13 is a drawing illustrating a read offset table group ROTb according to an exemplary embodiment of the present inventive concept.

Referring to FIG. 13, the read offset table group ROTb may correspond to the first read offset table group ROT1 of FIGS. 10A to 10C, for example. The read offset table group ROTb may include a plurality of read offset tables TABLE1 to TABLE4, each of which includes a plurality of read voltage offsets corresponding to a plurality of word line groups WLG0 to WLG3, respectively.

The first read offset table TABLE1 may include read voltage offsets V1a' to V1d' that correspond to the word line groups WLG0 to WLG3, respectively. Read voltage offsets that correspond to, respectively, different word line groups may be different from each other. However, read voltage offsets that correspond to, respectively, arbitrary word line groups may be the same as each other. For example, the first read offset table TABLE1 may be defined at the first read environment (e.g., RE1 of FIG. 9), the second read offset table TABLE2 may be defined at the second read environment (e.g., RE2 of FIG. 9), the third read offset table TABLE3 may be defined at the third read environment (e.g., RE3 of FIG. 9), and the fourth read offset table TABLE4 may be defined at the fourth read environment (e.g., RE4 of FIG. 9).

In an exemplary embodiment, the word line groups WLG0 to WLG3 may be determined based on channel hole sizes corresponding to word lines. In this case, read voltage offsets stored in the read offset table group ROTb may be determined based on channel hole sizes. For example, as the channel hole size becomes large, the charge loss speed may be slow. Read voltage offsets may be defined for respective word line groups to compensate for a variation in a threshold voltage distribution according to the channel hole size.

Figure 14:
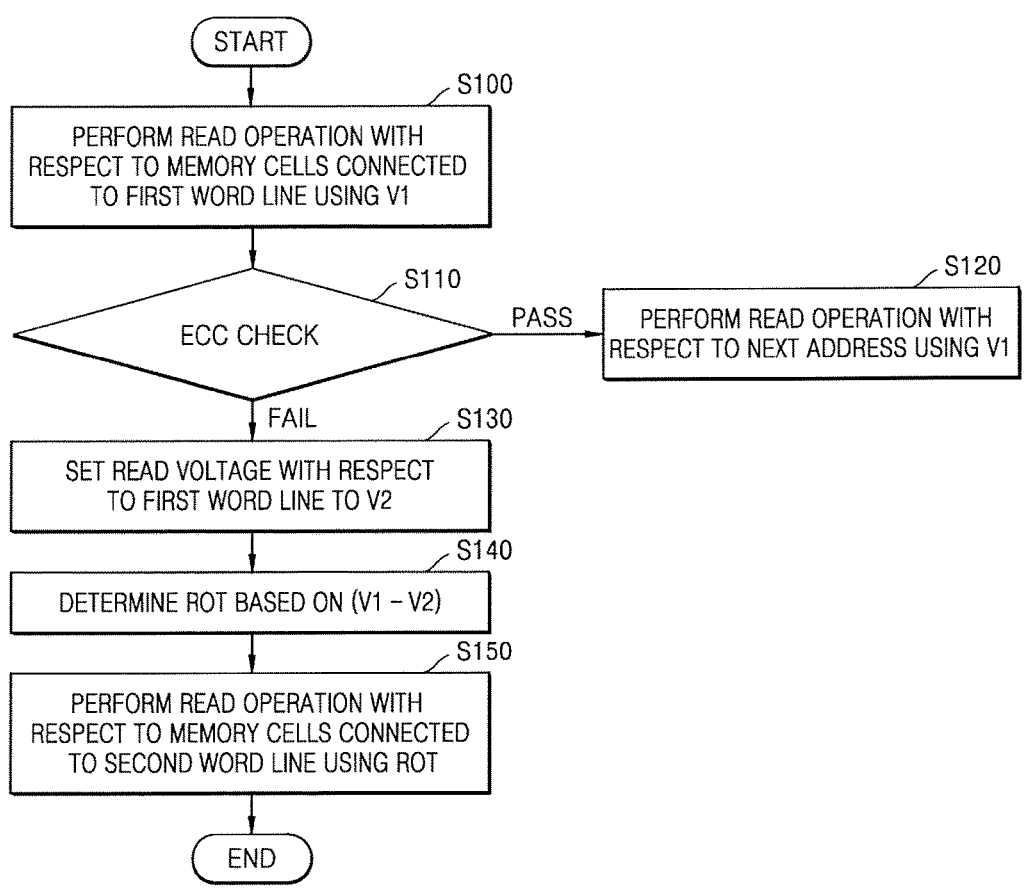
FIG. 14 is a flowchart illustrating a method of operating the memory device according to an exemplary embodiment of the present inventive concept.

FIG. 14 is a flowchart illustrating a method of operating the memory device according to an exemplary embodiment of the present inventive concept.

Referring to FIG. 14, a method of operating the memory device according to an embodiment of the inventive may be a method of performing a read operation with reference to the memory device and performing the read retry operation when the read operation fail. For example, the method according to the embodiment may include steps that are performed in time series at the memory device 300 of FIG.

3. Contents described with reference to FIGS. 1 to 13 may be applied to this embodiment, and a duplicated description thereof is thus omitted. Below, the method according to the embodiment will be described with reference to FIGS. 3 to 14.

In step S100, a read operation with respect to memory cells that are connected to a first word line may be performed by using a first read voltage level V1. Here, the first read voltage level V1 may be determined based on the initial threshold voltage distribution (e.g., 61 of FIG. 6) of memory cells. Here, the first word line may correspond to a read address. For example, according to the read address, any word line may be selected and thus the first word line may be any word line in the memory cell array 110 of FIG. 1, for example.

For example, the control logic circuit 120 may determine the first read voltage level V1 as a level of the read voltage with respect to the first word line and may generate the voltage control signal CTRL_vol. The voltage generator 130 may generate the read voltage having the first read voltage level V1 in response to the voltage control signal CTRL_vol. The row decoder 140 may apply the read voltage having the first read voltage level V1 to the first word line in response to the row address X-ADDR. The page buffer 150 may store data read from memory cells connected to the first word line and may count the number of fail bits of the stored data.

In step S110, an ECC check operation with respect to the read data may be performed to determine whether the read operation is successful or fails. If the determination result indicates that the read operation is successful, the method may proceed to step S120; if the determination result indicates that the read operation fails, the method may proceed to step S130. In step S120, a read operation with respect to a next address may be performed by using the first read voltage level V1. Here, the ECC check operation may be an operation of determining whether the number of fail bits of the read data is less than the reference value corresponding to the number of fail bits correctable with an ECC. For example, if the number of fail bits is less than the reference value, the control logic circuit 120 may determine that the read operation is successful. Meanwhile, if the number of fail bits is more than or equal to the reference value, the control logic circuit 120 may determine that the read operation fails.

In step S130, the read voltage with respect to the first word line may be set to have a second read voltage level V2. Here, the second read voltage level V2 may correspond to an optimum read voltage level and may be determined based on the changed threshold voltage distribution (e.g., 62 of FIG. 6) of memory cells. In an exemplary embodiment, as the read retry operation with respect to memory cells connected to the first word line is performed, the read voltage with respect to the first word line may be set to have the second read voltage level V2.

For example, the control logic circuit 120 may determine the second read voltage level V2 as a level of the read voltage with respect to the first word line and may generate the voltage control signal CTRL_vol. The voltage generator 130 may generate the read voltage having the second read voltage level V2 in response to the voltage control signal CTRL_vol. The row decoder 140 may apply the read voltage having the second read voltage level V2 to the first word line in response to the row address X-ADDR. The page buffer 150 may store data read from memory cells connected to the first word line and may count the number of fail bits of the stored data. In this case, if the number of fail bits is less than the reference value, the control logic circuit 120 may set the read voltage with respect to the first word line to have the second read voltage level V2.

In step S140, a read offset table may be determined based on a difference (i.e., V1-V2) between the first read voltage level V1 and the second read voltage level V2. For example, a read offset table group, which corresponds to the first word line, may be selected from among a plurality of read offset table groups defined in advance, for example, the read offset table groups of FIGS. 10A to 10C. For example, the read offset table group may be selected by using an address for the read operation. Depending on the configuration of the read offset table group (for example, FIGS. 10A to 10C), an address indicating to a block, a mat or a chip may be referenced to select the read offset table group. After the selection of the read offset table group, a read offset table, which corresponds to the first word line, from among the plurality of read offset tables defined in advance and included in the selected read offset table group may be selected based on a difference (i.e., V1-V2) between the first and second read voltage levels V1 and V2.

In an exemplary embodiment, the control logic circuit 120 may select a read offset table group, which corresponds to the first word line, from among a plurality of read offset table groups stored in a partial area of the memory cell array 110 or in the control logic circuit 120 and may select a read offset table from the selected read offset table group based on a difference between the first and second read voltage levels V1 and V2 corresponding to the first word line. For example, when the selected read offset table group is the read offset table group ROTa of FIG. 11 and when a difference between the first and second read voltage levels V1 and V2 corresponding to the first word line (e.g., WL0) is V1a, the control logic circuit 120 may select the read offset table TABLE1. However, embodiments of the inventive concept are not limited thereto. As another embodiment, step S140 may be performed at the read level controller 220 in the memory controller 200a of FIG. 2.

In step S150, a read operation with respect to memory cells connected to the second word line may be performed by using the read offset table. For example, the control logic circuit 120 may determine a third read voltage level as a level of a read voltage with respect to the second word line by selecting a read voltage offset corresponding to the second word line by using the determined read offset table and applying the read voltage offset to the first read voltage level V1 and may generate the voltage control signal CTRL_vol. For example, the applying of the read voltage offset to the first read voltage level V1 may include addition of the read voltage offset to the first read voltage level V1. The voltage generator 130 may generate the read voltage having the third read voltage level in response to the voltage control signal CTRL_vol. The row decoder 140 may apply the read voltage having the third read voltage level to the second word line in response to the row address X-ADDR.

Figure 15:
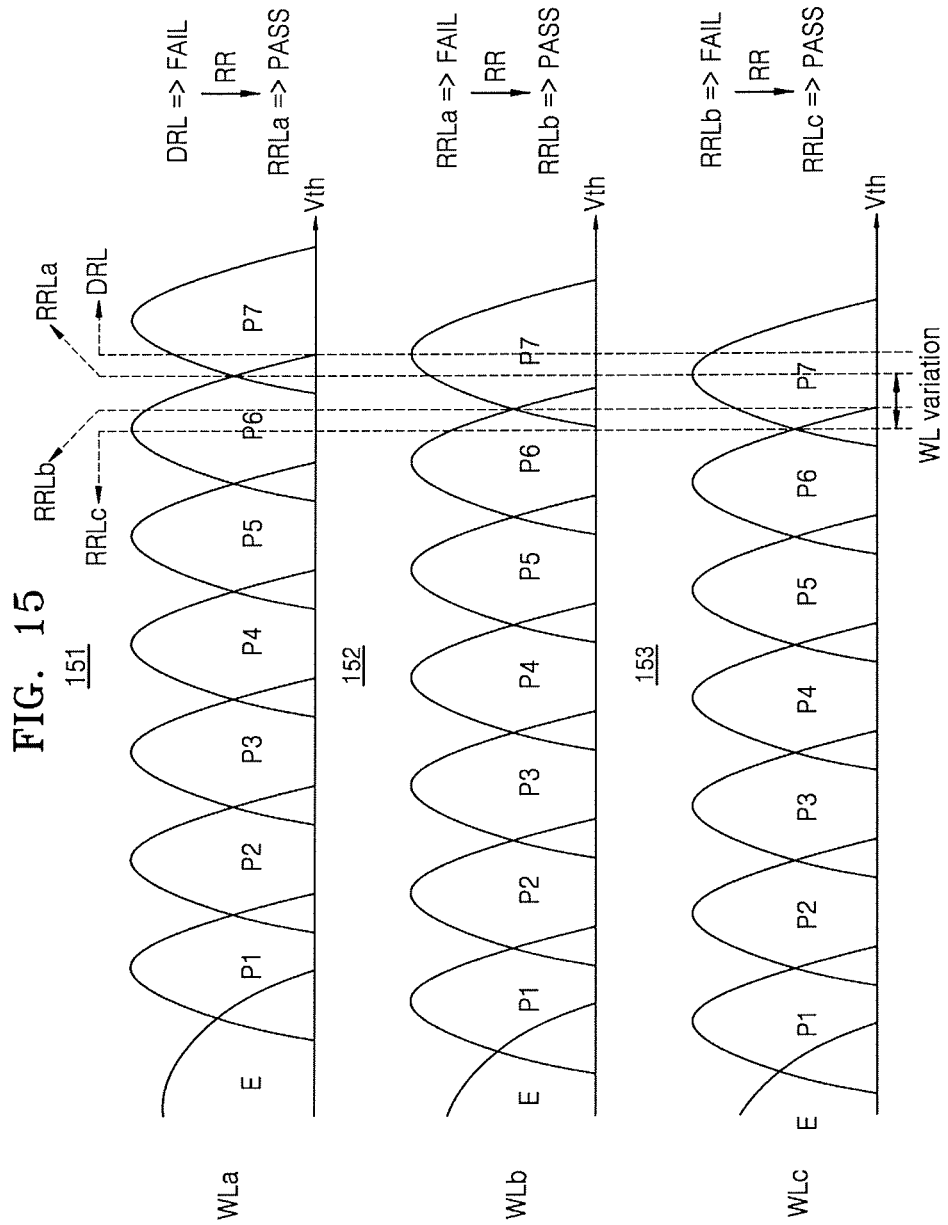
FIG. 15 shows graphs of first, second, and third threshold voltage distributions of memory cells connected to different word lines, according to a comparative example of this disclosure.

FIG. 15 shows graphs of first, second, and third threshold voltage distributions 151, 152, and 153 of memory cells connected to different word lines, according to a comparative example of this disclosure.

Referring to FIG. 15, the abscissa represents a threshold voltage Vth, and the ordinate represents the number of memory cells. For example, when a memory cell is a triple level cell in which three bits are programmed, the memory cell may have one of an erase state E and first to seventh program states P1 to P7. Each of the first to third threshold voltage distributions 151 to 153 may be a changed threshold voltage distribution of which the threshold voltages are changed after a program operation is completed and a predetermined time elapses.

The first threshold voltage distribution 151 indicates a changed threshold voltage distribution of memory cells connected to a first word line WLa. When a read operation that is performed under the condition that the default read voltage level DRL is applied to the first word line WLa fails, the read retry operation may be performed. During the read retry operation, a first read retry voltage level RRLa corresponding to a changed valley between the sixth and seventh program states P6 and P7 may be applied to the first word line WLa. In this case, a read operation may be successful.

The second threshold voltage distribution 152 indicates a changed threshold voltage distribution of memory cells connected to a second word line WLb. When a read operation that is performed under the condition that the first read retry voltage level RRLa is applied to the second word line WLb fails, the read retry operation may be performed. During the read retry operation, a second read retry voltage level RRLb corresponding to a changed valley between the sixth and seventh program states P6 and P7 may be applied to the second word line WLb. In this case, a read operation may be successful.

The third threshold voltage distribution 153 indicates a changed threshold voltage distribution of memory cells connected to a third word line WLc. When a read operation that is performed under the condition that the second read retry voltage level RRLb is applied to the third word line WLc fails, the read retry operation may be performed. During the read retry operation, a third read retry voltage level RRLc corresponding to a changed valley between the sixth and seventh program states P6 and P7 may be applied to the third word line WLc. In this case, a read operation may be successful.

According to the comparative example of FIG. 15, to compensate for differences among threshold voltage distribution variations of different word lines WLa, WLb, and WLc, the read retry operation may be performed whenever a read operation with respect to each word line is performed. Accordingly, a time taken to perform a read operation of a memory device may markedly increase. This may mean that the performance of the memory device is lowered overall.

Figure 16:
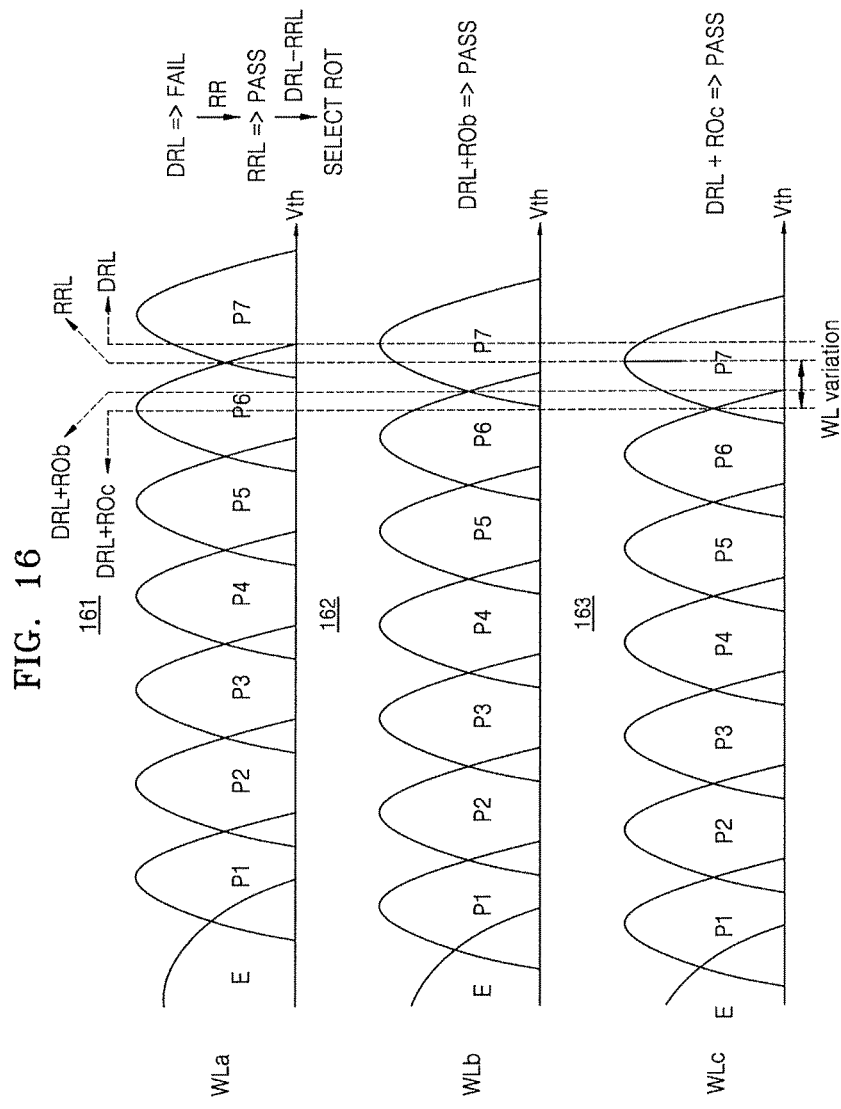
FIG. 16 shows graphs of first, second, and third threshold voltage distributions of memory cells connected to different word lines, according to an exemplary embodiment of the present inventive concept.

FIG. 16 shows graphs of first, second, and third threshold voltage distributions 161, 162, and 163 of memory cells connected to different word lines, according to an exemplary embodiment of the present inventive concept.

Referring to FIG. 16, the abscissa represents a threshold voltage Vth, and the ordinate represents the number of memory cells. For example, when a memory cell is a triple level cell in which three bits are programmed, the memory cell may have one of an erase state E and first to seventh program states P1 to P7. Each of the first to third threshold voltage distributions 161 to 163 may be a changed threshold voltage distribution of which the threshold voltages are changed after a program operation is completed and a predetermined time elapses.

The first threshold voltage distribution 161 indicates a changed threshold voltage distribution of memory cells connected to a first word line WLa. According to an embodiment, when a read operation that is performed under the condition that the default read voltage level DRL is applied to the first word line WLa fails, the read retry operation may be performed. During the read retry operation, a read retry voltage level RRL corresponding to a changed valley between the sixth and seventh program states P6 and P7 may be applied to the first word line WLa. In this case, the read operation may be successful. According to an embodiment, one of a plurality of read offset tables defined in advance may be selected based on a difference between the first and second read voltage levels.

The second threshold voltage distribution 162 indicates a changed threshold voltage distribution of memory cells connected to a second word line WLb. According to an embodiment, the control logic circuit 120 may determine an optimum read voltage level with respect to the second word line WLb by selecting a read voltage offset ROb corresponding to the second word line WLb from the selected read offset table and applying the read voltage offset ROb to the default read voltage level DRL. When a read operation with respect to the second word line WLb is performed by using the optimum read voltage level, the read operation may be successful even though the read retry operation is not performed.

The third threshold voltage distribution 163 indicates a changed threshold voltage distribution of memory cells connected to a third word line WLc. According to an embodiment, the control logic circuit 120 may determine an optimum read voltage level with respect to the third word line WLc by selecting a read voltage offset ROc corresponding to the third word line WLc from the selected read offset table and applying the read voltage offset ROc to the default read voltage level DRL. When a read operation with respect to the third word line WLc is performed by using the optimum read voltage level, the read operation may be successful even though the read retry operation is not performed.

According to the embodiment of FIG. 16, to compensate for a difference among threshold voltage distribution variations of different word lines WLa, WLb, and WLc, the read retry operation may be performed whenever a read operation with respect to each word line is performed. According to an embodiment, the read retry operation may be performed with respect to a word line where a read operation fails. A read offset table may be determined based on the result of the read retry operation, and an optimum read voltage level with respect to different word lines may be determined by using the determined read offset table. Accordingly, a time taken to perform a read operation of a memory device may markedly decrease. This may mean that the performance of the memory device is improved overall.

Figure 17:
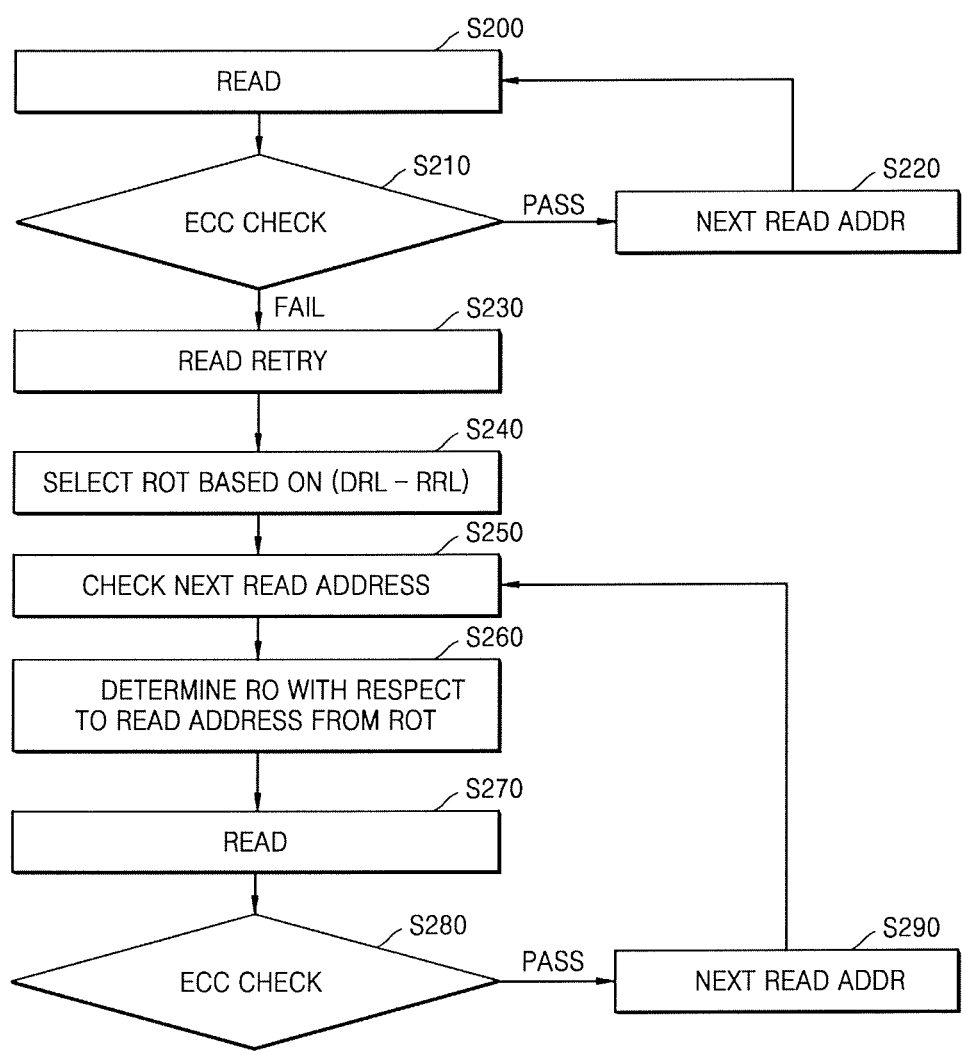
FIG. 17 is a flowchart illustrating, in more detail, a method of operating the memory device according to an exemplary embodiment of the present inventive concept.

FIG. 17 is a flowchart illustrating, in more detail, a method of operating the memory device according to an exemplary embodiment of the present inventive concept.

Referring to FIG. 17, the method of operating the memory device according to an embodiment may correspond to an implementation of the method of operating the memory device of FIG. 14. For example, the method according to the embodiment may include steps that are performed in time series at the memory device 300 of FIG. 3. Accordingly, contents described with reference to FIGS. 14 to 16 may be applied to this embodiment, and a duplicated description thereof is thus omitted.

In step S200, a read operation with respect to a current read address may be performed. For example, the read operation may be performed by applying a default read voltage level to a word line corresponding to the current read address. In step S210, an ECC check operation with respect to the read data may be performed to determine whether the read operation is successful or fails. If the determination result indicates that the read operation is successful, the method may proceed to step S220; if the determination result indicates that the read operation fails, the method may proceed to step S230. In step S220, a next read address may be received.

In step S230, a read retry operation may be performed to obtain an optimum read voltage level with respect to a word line corresponding to the read address. For example, when a read operation is successfully performed under the condition that a read retry voltage level is applied to a word line corresponding to the read address, the read retry voltage level may be determined as an optimum read voltage level.

In step S240, a read offset table may be selected based on a difference between the default read voltage level DRL and the read retry voltage level RRL. For example, one of a plurality of read offset tables exemplified in FIG. 11 or 13 may be selected. Hereinafter, it is assumed for the convenience of description that the read offset table TABLE1 of FIG. 11 is selected.

In step S250, a next read address may be checked. In step S260, a read voltage offset with respect to the next read address may be determined from a read offset table. For example, when the next read address corresponds to a word line WL1 of FIG. 11, a read voltage offset with respect to the next read address may be determined as V1$b$. Steps S240, S250, and S260 may constitute a history read operation and may be performed by using a history read algorithm.

In step S270, a read operation with respect to the next read address may be performed. For example, the read operation may be performed by applying a read voltage, which is obtained by applying a read voltage offset (e.g., V1$b$) to the default read voltage level DRL, to a word line corresponding to the next read address. In step S280, an ECC check operation with respect to the read data may be performed to determine whether the read operation is successful or fails. If the determination result indicates that the read operation is successful, the method may proceed to step S290. In step S290, a next read address may be received. Meanwhile, if the determination result indicates that the read operation fails, the read retry operation may be performed with respect to a corresponding read address.

Figure 18:
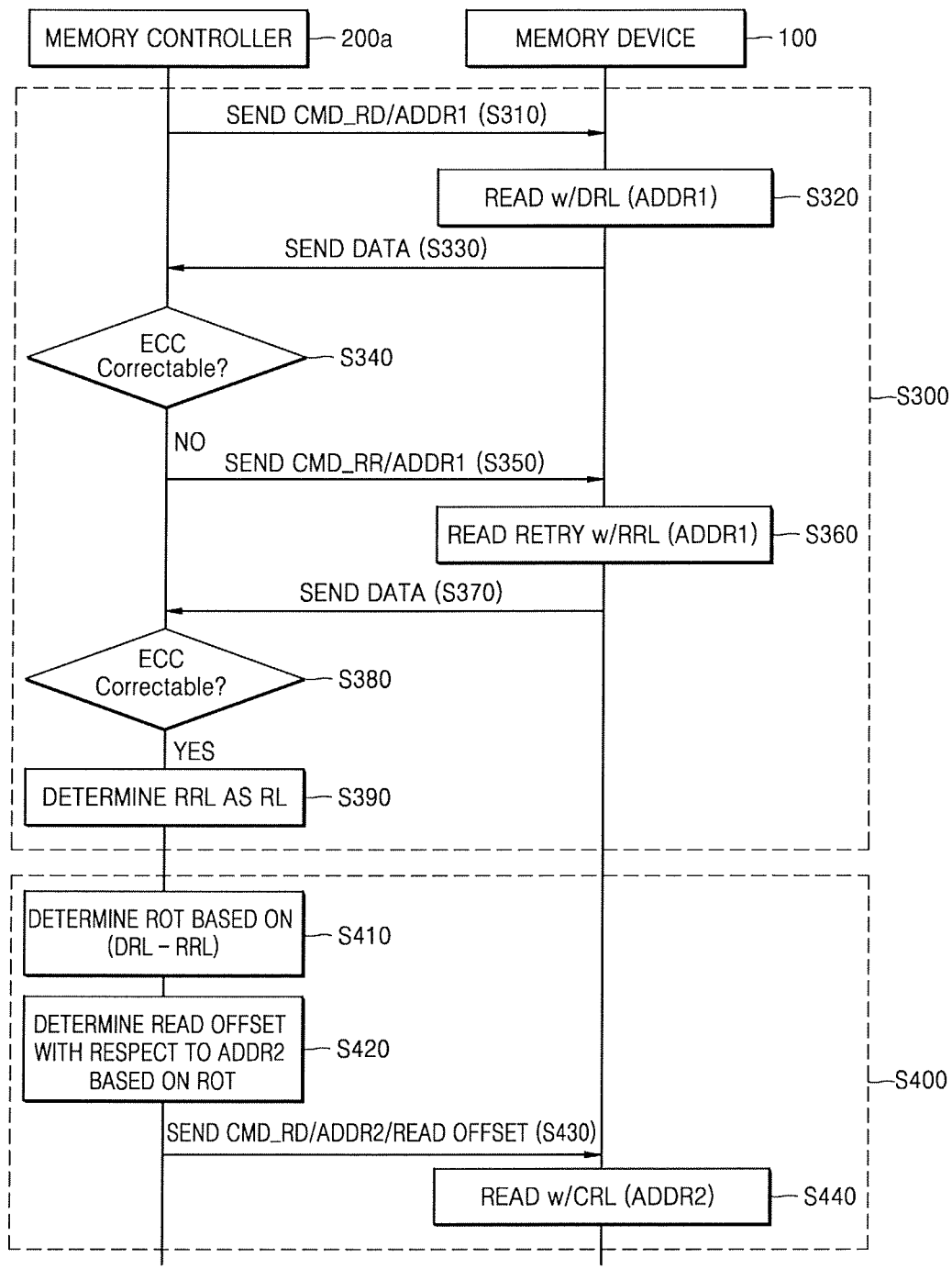
FIG. 18 is a flowchart illustrating a method of operating the memory system according to an exemplary embodiment of the present inventive concept.

FIG. 18 is a flowchart illustrating a method of operating the memory system according to an exemplary embodiment of the present inventive concept.

Referring to FIG. 18, the method of operating the memory system according to an embodiment may include a first read operation S300 with respect to a first address ADDR1 and a second read operation S400 with respect to a second address ADDR2. The first and second read operations S300 and S400 may include steps that are performed in time series at the memory device 100 and the memory controller 200$a$ of FIG. 2. Contents described with reference to FIGS. 1 to 17 may be applied to this embodiment, and a duplicated description thereof is thus omitted. Below, the method of operating the memory system according to an embodiment will be described with reference to FIGS. 2 and 18.

In step S310, the memory controller 200$a$ may send a command CMD_RD indicating a read operation and the first address ADDR1 to the memory device 100. In step S320, the memory device 100 may perform a read operation with respect to the first address ADDR1 by using the default read voltage level DRL. In an exemplary embodiment, in step S310, the memory device 100 may receive the default read voltage level DRL together with the command CMD_RD and the first address ADDR1. In an exemplary embodiment, the memory device 100 may receive the default read voltage level DRL before receiving the command CMD_RD and the first address ADDR1.

In step S330, the memory device 100 may send read data to the memory controller 200$a$. In step S340, the memory controller 200$a$ may determine whether fail bits of the read data are correctable with an error correction code (ECC). If the fail bits of the read data are correctable with the ECC, the ECC unit 230 included in the memory controller 200$a$ may perform an ECC decoding operation with respect to the fail bits of the read data. Afterwards, the read operation with respect to the first address ADDR1 may end. If the fail bits of the read data are uncorrectable with the ECC, the method may proceed to step S350.

In step S350, the memory controller 200$a$ may send a command CMD_RR indicating a read retry operation and the first address ADDR1. In step S360, the memory device 100 may perform the read retry operation with respect to the first address ADDR1 by using a read retry voltage level RRL. In an exemplary embodiment, in step S350, the memory device 100 may receive the read retry voltage level RRL together with the command CMD_RR and the first address ADDR1. In an exemplary embodiment, the memory device 100 may receive the read retry voltage level RRL before receiving the command CMD_RR and the first address ADDR1.

In step S370, the memory device 100 may send read data to the memory controller 200$a$. In step S380, the memory controller 200$a$ may determine whether fail bits of the read data are correctable with the ECC. If the fail bits of the read data are correctable with the ECC, the method may proceed to step S390. In contrast, if the fail bits of the read data are uncorrectable with the ECC, the memory controller 200$a$ may repeat the steps of 350 to 380.

In step S390, the memory controller 200$a$ may determine the read retry voltage level RRL as a read level. For example, the read level controller 220 included in the memory controller 200$a$ may determine the read retry voltage level RRL as an optimum read voltage level with respect to the first address ADDR1.

In step S410, the memory controller 200$a$ may determine a read offset table ROT based on a difference between the default read voltage level DRL and the read retry voltage level RRL. In step S420, the memory controller 200$a$ may determine a read voltage offset with respect to the second address ADDR2 based on the read offset table ROT. In step S430, the memory controller 200$a$ may send the command CMD_RD indicating a read operation and the second address ADDR2 to the memory device 100.

In step S440, the memory device 100 may perform a read operation with respect to the second address ADDR2 by using a corrected read voltage level CRL. For example, the memory device 100 may obtain the corrected read voltage level CRL by applying the read voltage offset to the default read voltage level DRL. The memory device 100 may perform the read operation by applying a read voltage having the corrected read voltage level CRL to a word line corresponding to the second address ADDR2.

Figure 19:
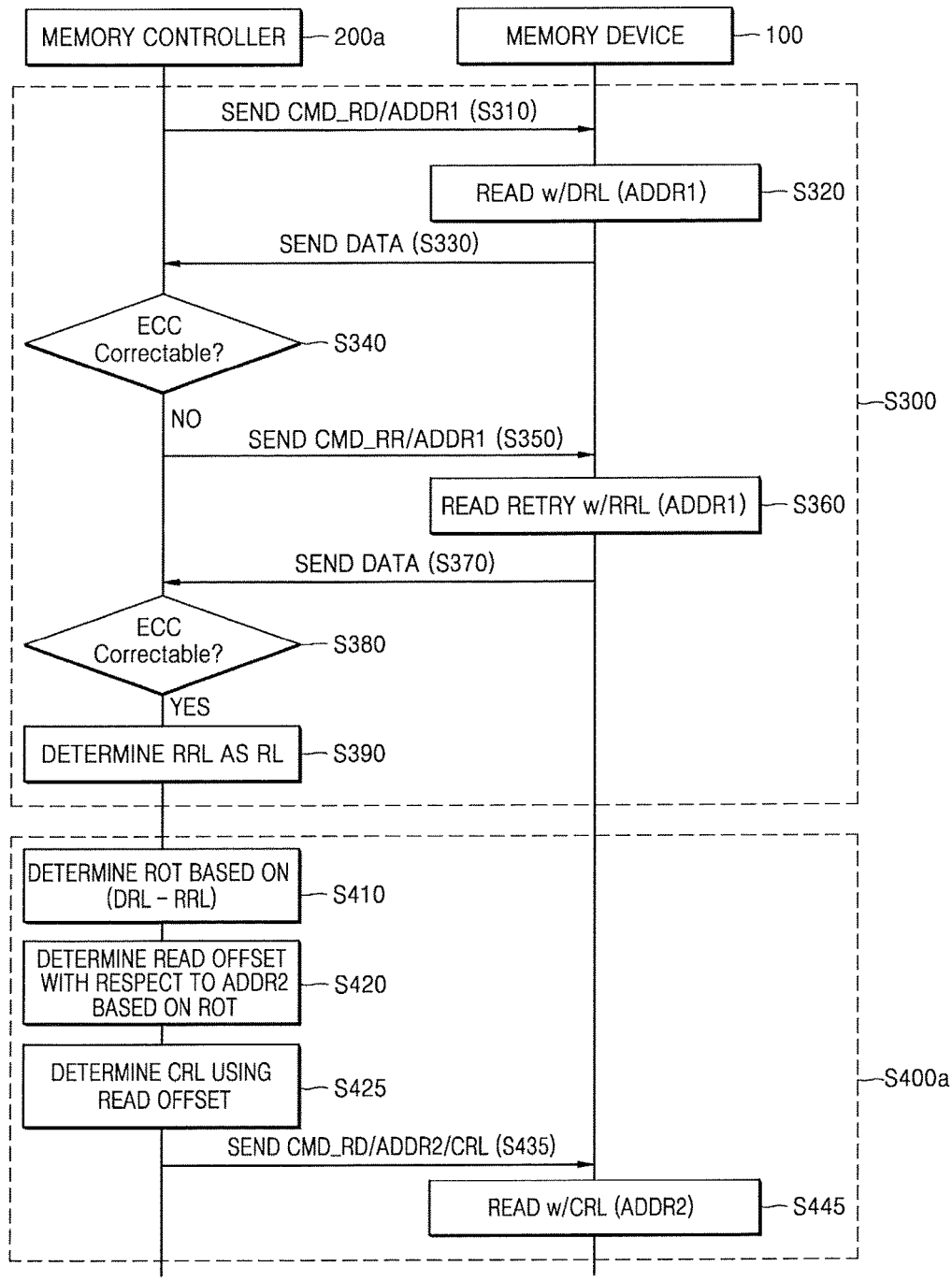
FIG. 19 is a flowchart illustrating a method of operating the memory system according to an exemplary embodiment of the present inventive concept.

FIG. 19 is a flowchart illustrating a method of operating the memory system according to an exemplary embodiment of the present inventive concept.

Referring to FIG. 19, the method of operating the memory system according to an embodiment may include a first read operation S300 with respect to a first address ADDR1 and a second read operation S400$a$ with respect to a second address ADDR2. The first and second read operations S300 and S400$a$ may include steps that are performed in time series at the memory device 100 and the memory controller 200$a$ of FIG. 2. The method of operating the system according to an embodiment may correspond to a modified embodiment of the method of FIG. 18. The first read operation S300 may be substantially the same as that of FIG. 18, and the second read operation S400a may be different from that of FIG. 18. Accordingly, a difference between embodiments of FIGS. 18 and 19 will be described below.

In step S410, the memory controller 200a may determine a read offset table ROT based on a difference between the default read voltage level DRL and the read retry voltage level RRL. In step S420, the memory controller 200a may determine a read voltage offset with respect to the second address ADDR2 based on the read offset table ROT.

In step S425, the memory controller 200a may determine a corrected read voltage level by using the read voltage offset. For example, the read level controller 220 included in the memory controller 200a may obtain the corrected read voltage level CRL by applying the read voltage offset to the default read voltage level DRL. In step S435, the memory controller 200a may send the command CMD_RD indicating a read operation, the second address ADDR2, and the corrected read voltage level CRL. In step S445, the memory device 100 may perform a read operation with respect to the second address ADDR2 by using the corrected read voltage level CRL.

Figure 20:
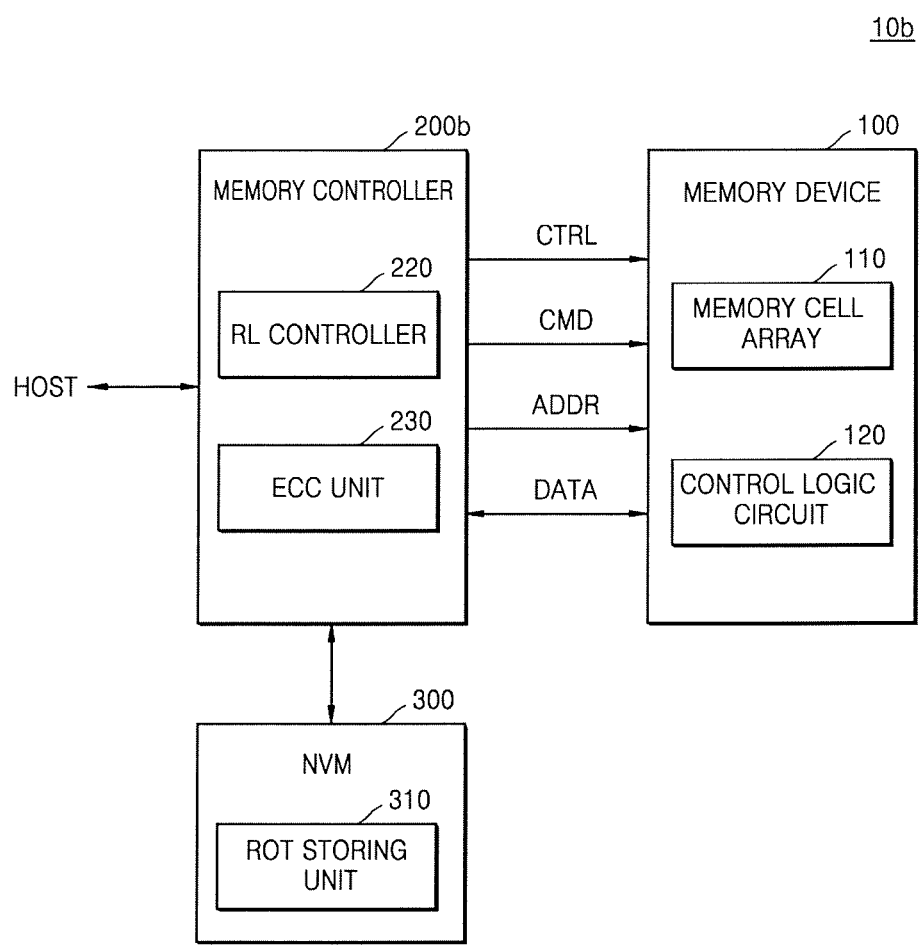
FIG. 20 is a block diagram illustrating a memory system according to an exemplary embodiment of the present inventive concept.

FIG. 20 is a block diagram illustrating a memory system 10b according to an exemplary embodiment of the present inventive concept.

Referring to FIG. 20, a memory system 10b may include the memory device 100, a memory controller 200b, and a nonvolatile memory 300. The memory system 10b according to an embodiment may correspond to an implementation of the memory system 10 of FIG. 1. Contents described with reference to FIG. 1 may be applied to this embodiment, and a duplicated description thereof is omitted.

The nonvolatile memory 300 may include a read offset table storing unit 310. The read offset table storing unit 310 may store a plurality of read offset table groups, each of which includes a plurality of read offset tables. Contents described with reference to FIGS. 10A to 10C may be applied to the read offset table groups, and contents described with reference to FIGS. 10A to 13 may be applied to the read offset tables.

The memory controller 200b may include the read level controller 220 and the ECC unit 230. Since the read level controller 220 and the ECC unit 230 may be substantially the same as those illustrated in FIG. 2, contents described with reference to FIG. 2 may be applied to this embodiment, and thus a description thereof is omitted.

Figure 21:
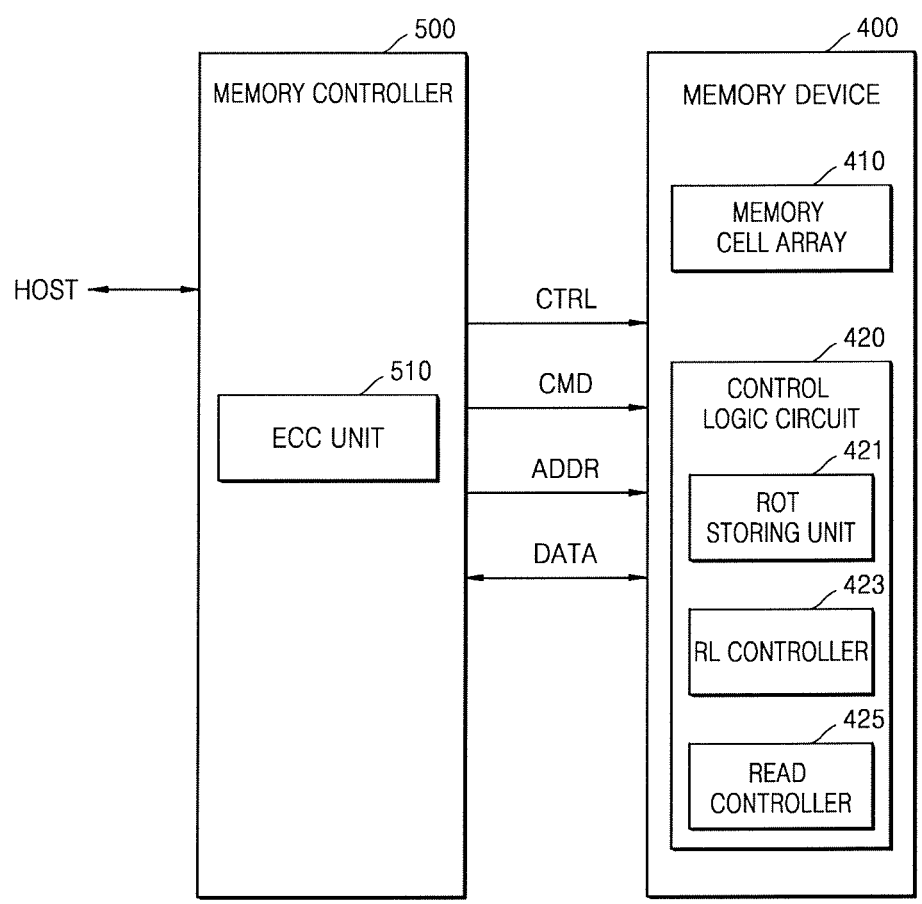
FIG. 21 is a block diagram illustrating a memory system according to an exemplary embodiment of the present inventive concept.

FIG. 21 is a block diagram illustrating a memory system 20 according to an embodiment.

Referring to FIG. 21, the memory system 20 may include a memory device 400 and a memory controller 500. The memory device 400 may include the memory cell array 410 and control logic circuit 420, and the memory controller 500 may include an ECC unit 510. The memory system 20 may be a modified exemplary embodiment of the memory system 10a of FIG. 2. The memory system 20 may be different from the memory system 10a of FIG. 2 in that a read offset table storing unit 421 and a read level controller 423 are included in the memory device 400. A difference between the memory system 10a of FIG. 2 and the memory system 20 of FIG. 21 will be described below.

The memory cell array 410 may be a 3D memory cell array that includes a plurality of memory cells connected to a plurality of word lines vertically stacked on a substrate. However, embodiments of the inventive concept are not limited thereto. For example, the memory cell array 410 may be a 2D memory cell array. Contents about the memory cell array 110 described with reference to FIGS. 3 to 5 may be applied to the memory cell array 410 according to an embodiment.

The control logic circuit 420 may include the read offset table storing unit 421, the read level controller 423, and a read controller 425. The read offset table storing unit 421 may store a plurality of read offset table groups, each of which includes a plurality of read offset tables. For example, the read offset table storing unit 421 may be implemented with a register. Contents about the read offset table groups described with reference to FIGS. 10A to 13 may be applied to this embodiment.

The read level controller 423 may control a read voltage, which is to be applied to a first word line corresponding to a first address received from the memory controller 500, to have a first read voltage level. Here, the first read voltage level may be an optimum read voltage level that is determined based on an initial threshold voltage distribution of memory cells. When a read operation performed by using the first read voltage level fails, the read level controller 423 may control a read voltage, which is to be applied to the first word line, to have the second read voltage level. When a read operation performed by using the second read voltage level is successful, the read level controller 423 may set the second read voltage level as an optimum read voltage level.

The read level controller 423 may select one of the plurality of offset tables, which are stored in the read offset table storing unit 421, based on a difference between the first and second read voltage levels. Afterwards, the read level controller 423 may obtain a read voltage offset, which corresponds to a second word line corresponding to a second address received from the memory controller 500 after the first read operation is performed, from the selected read offset table. Furthermore, the read level controller 423 may apply the obtained read voltage offset to the first read voltage level such that a third read voltage that is to be applied to the second word line corresponding to the second address is determined based on the first read voltage level of the first word line and the read voltage offset of the second word line.

The read controller 425 may generate a voltage control signal such that a read voltage that has the first read voltage level determined at the read level controller 423 is applied to the first word line. Furthermore, the read controller 425 may generate the voltage control signal such that a read voltage that has the second read voltage level determined at the read level controller 423 is applied to the first word line. Furthermore, the read controller 425 may generate the voltage control signal such that a read voltage that has the third read voltage level determined at the read level controller 423 is applied to the second word line.

The ECC unit 510 may perform an error correction operation with respect to data received from the memory device 400. For example, the ECC unit 510 may compare a parity bit(s), which is generated and stored in programming data, with a parity bit(s), which is generated in reading data, and may detect an error bit(s) based on the comparison result. The ECC unit 510 may correct the error bit(s) by performing a predetermined logical operation (e.g., an exclusive OR (XOR) operation) with respect to the detected error bit(s).

Figure 22:
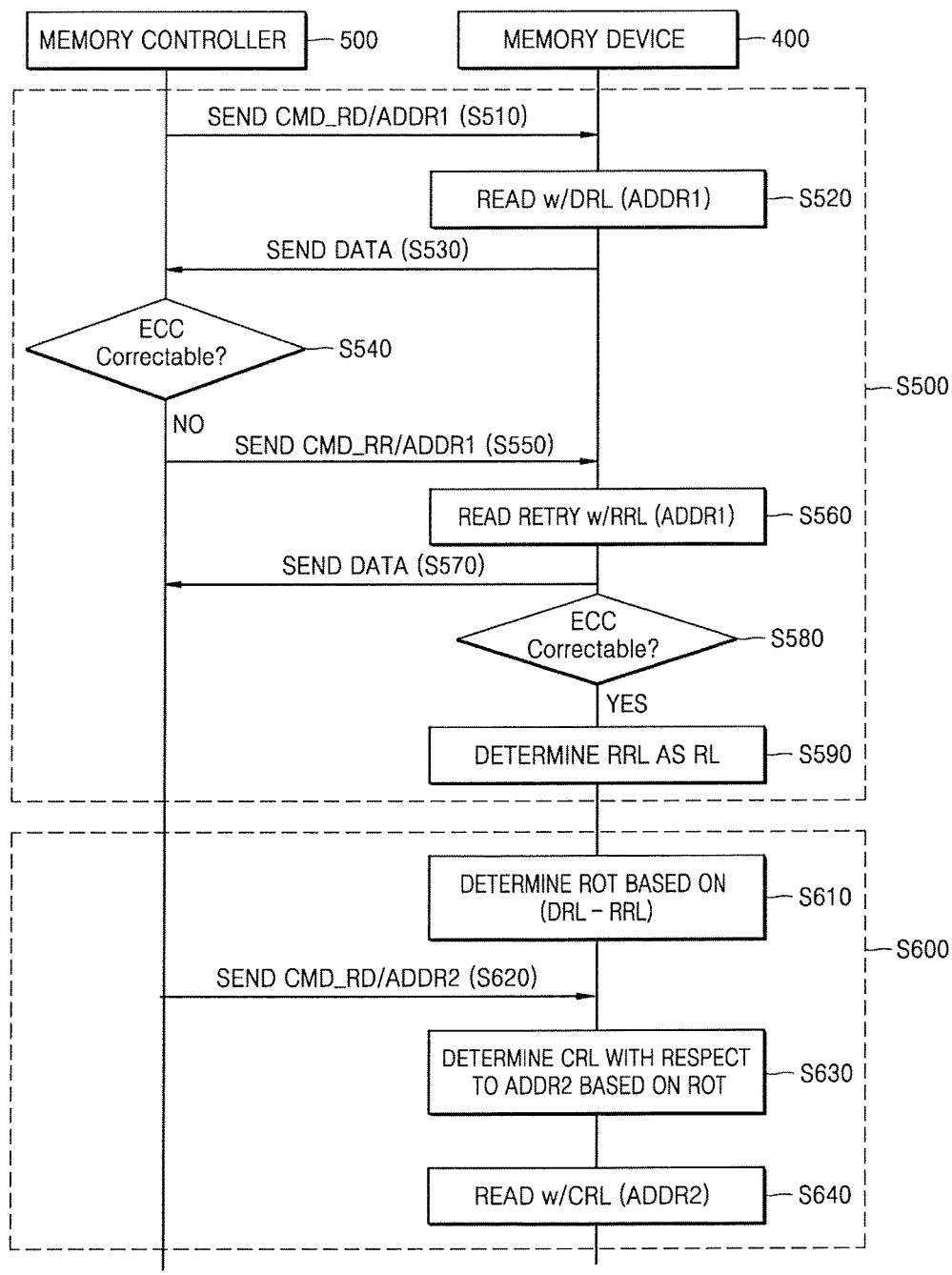
FIG. 22 is a flowchart illustrating a method of operating the memory system according to an exemplary embodiment of the present inventive concept.

FIG. 22 is a flowchart illustrating a method of operating the memory system according to an exemplary embodiment of the present inventive concept.

Referring to FIG. 22, the method of operating the memory system may include a first read operation S5500 with respect to a first address ADDR1 and a second read operation S5600 with respect to a second address ADDR2. The first and second read operations 5500 and 5600 may include steps that are performed in time series at the memory device 400 and the memory controller 500 of FIG. 21.

In step S510, the memory controller 500 may send a command CMD_RD indicating a read operation and the first address ADDR1 to the memory device 400. In step S520, the memory device 400 may perform a read operation with respect to the first address ADDR1 by using the default read voltage level DRL. In an exemplary embodiment, in step S510, the memory device 400 may receive the default read voltage level DRL together with the command CMD_RD and the first address ADDR1. In an exemplary embodiment, the memory device 400 may receive the default read voltage level DRL before receiving the command CMD_RD and the first address ADDR1.

In step S530, the memory device 400 may send read data to the memory controller 500. In step S540, the memory controller 500 may determine whether fail bits of the read data are correctable with the ECC. If the fail bits of the read data are correctable with the ECC, the ECC unit 510 included in the memory controller 500 may perform an ECC decoding operation with respect to the fail bits of the read data. Afterwards, the read operation with respect to the first address ADDR1 may end. If the fail bits of the read data are uncorrectable with the ECC, the method may proceed to step S550.

In step S550, the memory controller 500 may send a command CMD_RR indicating a read retry operation and the first address ADDR1 to the memory device 400. In step S560, the memory device 400 may perform the read retry operation with respect to the first address ADDR1 by using a read retry voltage level RRL. In an exemplary embodiment, in step S550, the memory device 400 may receive the read retry voltage level RRL together with the command CMD_RR and the first address ADDR1. In an exemplary embodiment, the memory device 400 may receive the read retry voltage level RRL before receiving the command CMD_RR and the first address ADDR1.

In step S570, the memory device 400 may send read data to the memory controller 500. In step S580, the memory controller 400 may determine whether fail bits of the read data are correctable with the ECC. If the fail bits of the read data are correctable with the ECC, the method may proceed to step S590. In an exemplary embodiment, step S580 may be performed at the same time at the memory controller 500. If the fail bits of the read data are uncorrectable with the ECC, the memory controller 500 may repeat the steps S550 to S570.

In step S590, the memory device 400 may determine the read retry voltage level RRL as a read level. For example, the read level controller 423 included in the memory device 400 may determine the read retry voltage level RRL as an optimum read voltage level with respect to the first address ADDR1.

In step S610, the memory device 400 may determine a read offset table ROT based on a difference between the default read voltage level DRL and the read retry voltage level RRL. In step S620, the memory controller 500 may send a command CMD_RD indicating a read operation and a second address ADDR2 to the memory device 400. In another embodiment, step S610 may be performed after step S620 is first performed.

In step S630, the memory device 400 may determine a read voltage level with respect to the second address ADDR2 based on the read offset table ROT. For example, the read level controller 423 included in the memory device 400 may determine a read voltage offset based on the read offset table ROT and may obtain a corrected read voltage level CRL by applying the determined read voltage offset to the default read voltage level DRL.

In step S640, the memory device 400 may perform a read operation with respect to the second address ADDR2 by using the corrected read voltage level CRL. For example, the memory device 400 may perform the read operation by applying a read voltage having the corrected read voltage level CRL to a word line corresponding to the second address ADDR2.

Figure 23:
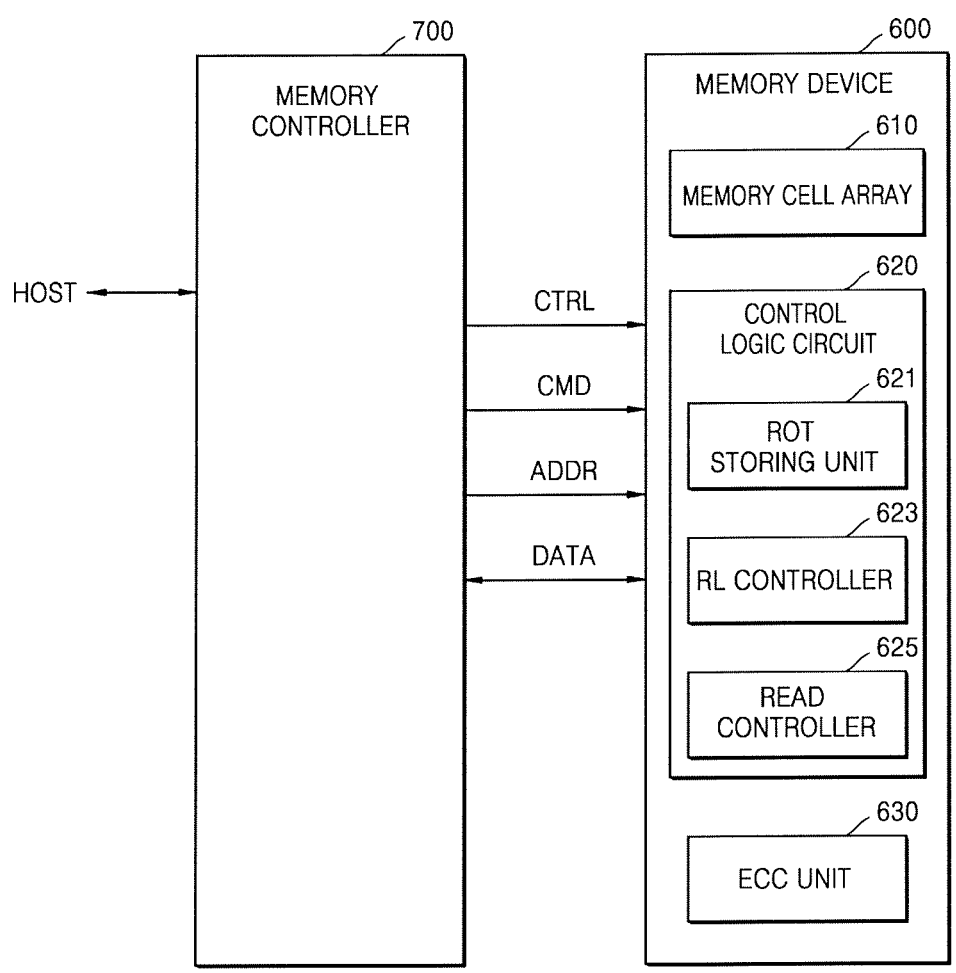
FIG. 23 is a block diagram illustrating a memory system according to an exemplary embodiment of the present inventive concept.

FIG. 23 is a block diagram illustrating a memory system 30 according to an exemplary embodiment of the present inventive concept.

Referring to FIG. 23, the memory system 30 may include a memory device 600 and a memory controller 700. The memory device 600 may include a memory cell array 610, control logic circuit 620, and an ECC unit 630. The memory system 30 according to an embodiment may be a modified embodiment of the memory system 20 of FIG. 21. The memory system 30 may be different from the memory system 20 of FIG. 21 in that the ECC unit 630 is included in the memory device 600. A difference between the memory system 20 of FIG. 21 and the memory system 30 of FIG. 23 will be described below.

The memory cell array 610 may be a 3D memory cell array that includes a plurality of memory cells connected to a plurality of word lines vertically stacked on a substrate. However, embodiments of the inventive concept are not limited thereto. For example, the memory cell array 610 may be a 2D memory cell array. Contents about the memory cell array 110 described with reference to FIGS. 3 to 5 may be applied to the memory cell array 610 according to an embodiment.

The control logic circuit 620 may include a read offset table storing unit 621, a read level controller 623, and a read controller 625. The read offset table storing unit 621 may store a plurality of read offset table groups, each of which includes a plurality of read offset tables. For example, the read offset table storing unit 621 may be implemented with a register. Contents about the read offset table groups described with reference to FIGS. 10A to 13 may be applied to this embodiment.

The read level controller 623 may control a read voltage, which is to be applied to a first word line corresponding to a first address received from the memory controller 700, to have a first read voltage level. Here, the first read voltage level may be an optimum read voltage level that is determined based on an initial threshold voltage distribution of memory cells. When a read operation performed by using the first read voltage level fails, the read level controller 623 may control a read voltage, which is to be applied to the first word line, to have the second read voltage level. When a read operation performed by using the second read voltage level is successful, the read level controller 623 may set the second read voltage level as an optimum read voltage level.

The read level controller 623 may select one of the plurality of offset tables, which are stored in the read offset table storing unit 621, based on a difference between the first and second read voltage levels. Afterwards, the read level controller 621 may obtain a read voltage offset, which corresponds to a second word line corresponding to a second address received from the memory controller 700 after the first read operation is performed, from the selected read offset table. Furthermore, the read level controller 621 may apply the obtained read voltage offset to the first read voltage level such that a third read voltage that is to be applied to the second word line corresponding to the second address is generated based on the first read voltage level and the read voltage offset of the second word line.

The read controller 625 may generate a voltage control signal such that a read voltage that has the first read voltage level determined at the read level controller 623 is applied to the first word line. Furthermore, the read controller 625 may generate the voltage control signal such that a read voltage that has the second read voltage level determined at the read level controller 623 is applied to the first word line. Furthermore, the read controller 625 may generate the voltage control signal such that a read voltage that has the third read voltage level determined at the read level controller 623 is applied to the second word line.

The ECC unit 630 may perform an error correction operation with respect to data received from the memory cell array 610. For example, the ECC unit 630 may compare a parity bit(s), which is generated and stored in programming data, with a parity bit(s), which is generated in reading data, and may detect an error bit(s) based on the comparison result. The ECC unit 630 may correct the error bit(s) by performing a predetermined logical operation (e.g., an exclusive OR (XOR) operation) with respect to the detected error bit(s).

Figure 24:
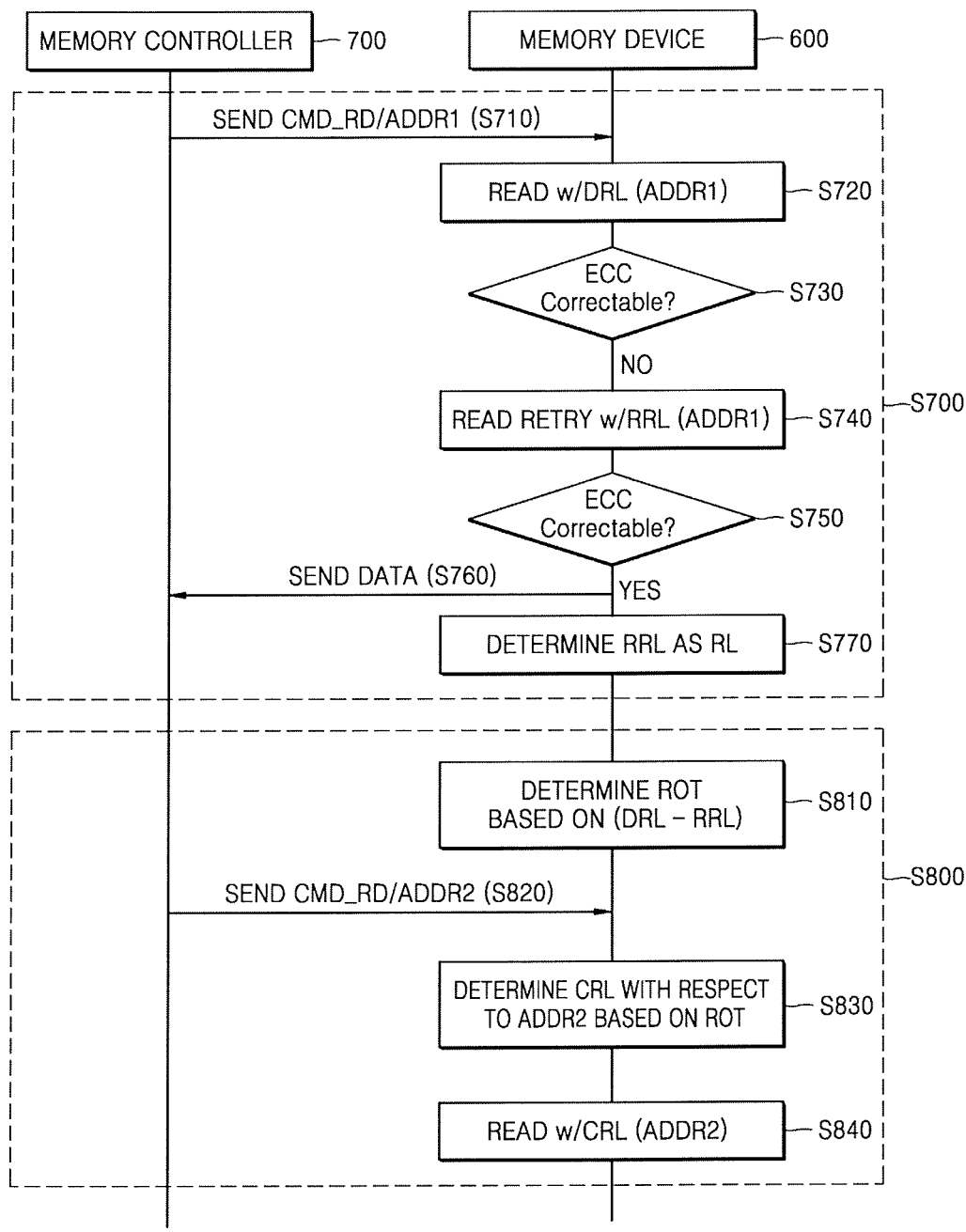
FIG. 24 is a flowchart illustrating a method of operating the memory system according to an exemplary embodiment of the present inventive concept.

FIG. 24 is a flowchart illustrating a method of operating the memory system according to an exemplary embodiment of the present inventive concept.

Referring to FIG. 24, the method of operating the memory system according to an embodiment may include a first read operation S700 with respect to a first address ADDR1 and a second read operation S800 with respect to a second address ADDR2. The first and second read operations S700 and S800 may include steps that are performed in time series at the memory device 600 and the memory controller 700 of FIG. 23.

In step S710, the memory controller 700 may send a command CMD_RD indicating a read operation and a first address ADDR1 to the memory device 600. In step S620, the memory device 600 may perform a read operation with respect to the first address ADDR1 by using the default read voltage level DRL. In an exemplary embodiment, in step S710, the memory device 600 may receive the default read voltage level DRL together with the command CMD_RD and the first address ADDR1. In an exemplary embodiment, the memory device 600 may receive the default read voltage level DRL before receiving the command CMD_RD and the first address ADDR1.

In step S730, the memory controller 600 may determine whether fail bits of the read data are correctable with an ECC. If the fail bits of the read data are correctable with the ECC, the ECC unit 630 included in the memory device 600 may perform an ECC decoding operation with respect to the fail bits of the read data. Afterwards, the read operation with respect to the first address ADDR1 may end. If the fail bits of the read data are uncorrectable with the ECC, the method may proceed to step S740.

In step S740, the memory device 600 may perform the read retry operation with respect to the first address ADDR1 by using a read retry voltage level RRL. In an exemplary embodiment, in step S710, the memory device 600 may receive the read retry voltage level RRL together with the command CMD_RR and the first address ADDR1. In an exemplary embodiment, the memory device 600 may receive the read retry voltage level RRL before receiving the command CMD_RR and the first address ADDR1. In an exemplary embodiment, the memory device 600 may internally determine the read retry voltage level.

In step S750, the memory controller 700 may determine whether fail bits of the read data are correctable with an ECC. If the fail bits of the read data are correctable with the ECC, the method may proceed to step S760. In step S760, the memory device 600 may send read data to the memory controller 700. Meanwhile, if the fail bits of the read data are uncorrectable with the ECC, the memory device 600 may perform step S740 again. In this case, the memory device 600 may perform the read retry operation with respect to the first address ADDR1 by using a changed read retry voltage level. In step S770, the memory device 600 may determine the read retry voltage level RRL as a read level. For example, the read level controller 623 included in the memory device 600 may determine the read retry voltage level RRL as an optimum read voltage level with respect to the first address ADDR1.

In step S810, the memory device 600 may determine a read offset table ROT based on a difference between the default read voltage level DRL and the read retry voltage level RRL. In step S820, the memory controller 700 may send a command CMD_RD indicating a read operation and a second address ADDR2 to the memory device 600. In another embodiment, step S810 may be performed after step S820 is first performed.

In step S830, the memory device 600 may determine a corrected read voltage level CRL with respect to the second address ADDR2 based on the read offset table ROT. For example, the read level controller 623 included in the memory device 600 may determine a read voltage offset based on the read offset table ROT and may obtain a corrected read voltage level CRL by applying the determined read voltage offset to the default read voltage level DRL.

In step S840, the memory device 600 may perform a read operation with respect to the second address ADDR2 by using the corrected read voltage level CRL. For example, the memory device 600 may perform the read operation by applying a read voltage having the corrected read voltage level CRL to a word line corresponding to the second address ADDR2.

Figure 25:
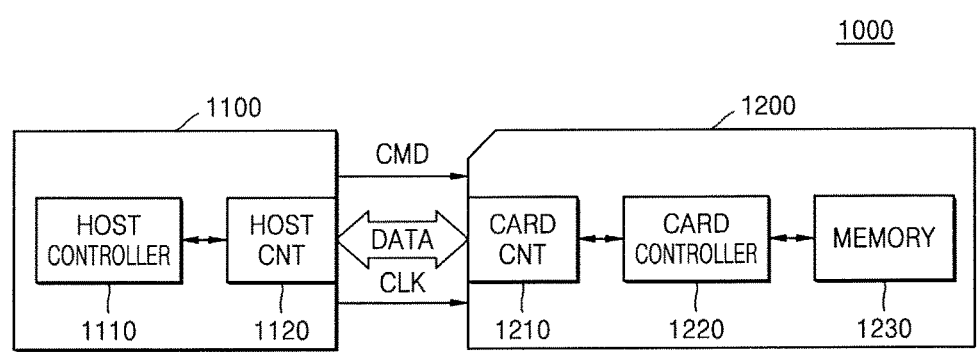
FIG. 25 is a block diagram illustrating a memory card system according to an exemplary embodiment of the present inventive concept.

FIG. 25 is a block diagram illustrating a memory card system 1000 according to an exemplary embodiment of the present inventive concept.

Referring to FIG. 25, the memory card system 1000 may include a host 1100 and a memory card 1200. The host 1100 may include a host controller 1110 and a host connecter 1120. The memory card 1200 may include a card connecter 1210, a card controller 1220, and a memory device 1230. In an exemplary embodiment, the memory card 1200 may be implemented by using embodiments described with reference to FIGS. 1 to 24.

For example, the memory card 1200 may control a read operation with respect to memory cells, which are connected to a first word line, by using a first read voltage level in a read section. When the read operation fails, the memory card 1200 may control a read retry operation with respect to the memory cells, which are connected to the first word line, by using a second read voltage level. When the read retry operation is successful, the second read voltage level may be set to an optimum read voltage level with respect to the first word line. Furthermore, the memory card 1200 may control a read operation with respect to second memory cells, which are connected to a second word line corresponding to a next read address, by using a read offset table determined according to a difference between the first and second read voltage levels.

The memory card 1200 may be configured to communicate with the host 1100 through at least one of various interface protocols such as MMC, PCI-E, ATA (Advanced Technology Attachment), Serial-ATA, Parallel-ATA, SCSI, ESDI, and IDE (Integrated Drive Electronics).

The host 1100 may write data in the memory card 1200 or may read data stored in the memory card 1200. The host controller 1110 may send a command, a clock signal CLK generated from a clock generator (not illustrated) in the host 1100, and data to the memory card 1200 through the host connecter 1120.

The card controller 1220 may store data in the flash memory 1220 in response to a write command received through the card connecter 1210, and in particular, the data may be stored in the memory device 1220 in synchronization with a clock signal generated from a clock generator (not illustrated) in the card controller 1220. The memory device 1220 may store data provided from the host 1100.

The memory card 1200 may be implemented with a compact flash card (CFC), a microdrive, a smart media card (SMC), a multimedia card (MMC), a security digital card (SDC), a memory stick, a USB flash memory driver, and the like.

Figure 26:
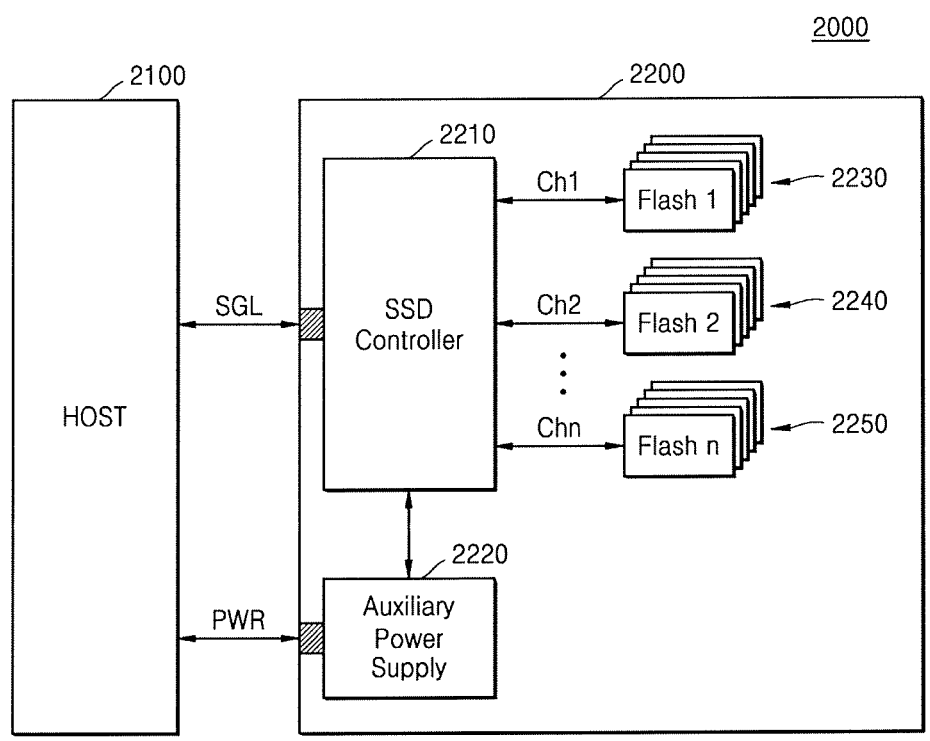
FIG. 26 is a block diagram illustrating a solid state drive system according to an exemplary embodiment of the present inventive concept.

FIG. 26 is a block diagram illustrating a solid state drive system 2000 according to an exemplary embodiment of the present inventive concept.

Referring to FIG. 26, the solid state drive (SSD) system 2000 may include a host 2100 and an SSD 2200. The SSD 2200 may exchange a signal with the host 2100 through a signal connector and may receive power through a power connector. The SSD 2200 may include an SSD controller 2210, an auxiliary power supply 2220, and a plurality of memory devices 2230, 22240, and 2250. In an exemplary embodiment, the SSD 2200 may be implemented by using embodiments described with reference to FIGS. 1 to 25.

For example, each of the plurality of memory devices 2230 to 2250 may control a read operation with respect to memory cells, which are connected to a first word line, by using a first read voltage level in a read section. When the read operation fails, each of the plurality of memory devices 2230 to 2250 may control a read retry operation with respect to the memory cells, which are connected to the first word line, by using a second read voltage level. When the read retry operation is successful, the second read voltage level may be set as an optimum read voltage level with respect to the first word line. Furthermore, each of the plurality of memory devices 2230 to 2250 may control a read operation with respect to second memory cells, which are connected to a second word line corresponding to a next read address, by using a read offset table determined according to a difference between the first and second read voltage levels.

A nonvolatile memory device, a card controller, and a memory card according to embodiments of the inventive concept may be packaged according to any of a variety of different packaging technologies. Examples of such packaging technologies may include the following: package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi-chip package (MCP), wafer-level fabricated package (WFP), and wafer-level processed stack package (WSP).

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of operating a nonvolatile memory device that includes a three-dimensional (3D) memory cell array, the method comprising:
  performing a first normal read operation on first memory cells connected to a first word line by using a first read voltage level;
  performing, if the first normal read operation fails, a read retry operation on the first memory cells so that a read retry voltage level is set to a second read voltage level;
  selecting a read offset table from a plurality of read offset tables based on a difference between the first read voltage level and the second read voltage level, wherein the selected read offset table stores a plurality of read voltage offsets, each of the read voltage offsets corresponding to a respective one of a plurality of word lines, and each of the read voltage offsets being used to determine a level of a read voltage in a normal read operation; and
  performing a second normal read operation on second memory cells connected to a second word line by using a third read voltage level determined using a read voltage offset corresponding to the second word line from the selected read offset table.

2. The method of claim 1, further comprising:
  storing the plurality of read offset tables.

3. The method of claim 2, wherein each of the plurality of read offset tables is defined according to a read environment including a retention time or a read disturb.

4. The method of claim 2, wherein the plurality of read offset tables is stored in a partial area of the 3D memory cell array.

5. The method of claim 2, wherein the plurality of read offset tables is defined by a memory block unit, by a mat unit, or by a chip unit.

6. The method of claim 2, wherein the word lines include a plurality of word line groups,
  wherein the word line groups are positioned at different distances from a substrate.

7. The method of claim 1, wherein the read retry operation is performed on the first memory cells using the read retry voltage level, and
  wherein if the read retry operation is successful, the read retry voltage level is set to the second read voltage level.

8. The method of claim 1, wherein the performing of the second read operation comprises:
  generating the third read voltage level based on the read voltage offset corresponding to the second word line and the first read voltage level, wherein the read voltage offset corresponding to the second word line is selected from the selected read offset table.

9. The method of claim 1, wherein the 3D memory cell array includes a channel hole penetrating the plurality of word lines, and
  wherein the plurality of read voltage offsets are determined according to a size of the channel hole size corresponding to each of the plurality of word lines.

10. A method of operating a memory system including a nonvolatile memory device that includes a 3D memory cell array and a memory controller configured to control the nonvolatile memory device, the method comprising:

performing a first normal read operation on first memory cells connected to a first word line by using a first read voltage level;

performing, if the first normal read operation fails, a read retry operation using a read retry voltage on the first memory cells, wherein the read retry voltage is set to a second read voltage level;

selecting by the memory controller, a read offset table from a plurality of read offset tables based on a difference between the first read voltage level and the second read voltage level, wherein the selected read offset table stores a plurality of read voltage offsets, each of the read voltage offsets corresponding to a respective one of a plurality of word lines, and each of the read voltage offsets being used to determine a level of a read voltage in a normal read operation;

sending, by the memory controller, a read voltage offset selected from the plurality of read voltage offsets of the read offset table to the nonvolatile memory device, wherein the selected read voltage offset corresponds to a second word line; and performing a second normal read operation on second memory cells connected to the second word line by using the selected read voltage offset.

11. The method of claim 10, further comprising:
storing the plurality of read offset tables.

12. The method of claim 11, wherein the plurality of read offset tables is stored in a buffer memory included inside the memory controller or in a nonvolatile memory placed outside the memory controller.

13. The method of claim 10, further comprising:
comparing a number of fail bits of data obtained from the first normal read operation with a reference value corresponding to a number of fail bits correctable with an error correction code to determine whether the first normal read operation fails; and determining, if the read retry operation is successful, the read retry voltage as the second read voltage level.

14. The method of claim 13, wherein the comparing of the number of fail bits of data and the determining of the read retry voltage are performed by the nonvolatile memory device.

15. The method of claim 13, wherein the comparing of the number of fail bits of data and the determining of the read retry voltage are performed by the memory controller.

16. A method of operating a nonvolatile memory device that includes a three-dimensional (3D) memory cell array, the method comprising:

performing a plurality of read operations including a first read operation on the 3D memory cell array, wherein the first read operation is firstly performed on a first word line using a first read voltage level among the plurality of read operations;

performing a read retry operation on the first word line using a second read voltage level after the first read operation is firstly performed and before a second read operation is secondly performed on a second word line; and generating a third read voltage level based on the first read voltage level and a read voltage offset of the second word line, wherein the second read operation is performed using the third read voltage level, wherein the first and second read operations are not read retry operations, and wherein the read voltage offset of the second word line is stored in a read offset table group.

17. The method of claim 16, further comprising:
selecting the read offset table group from a plurality of read offset table groups based on an address of the first read operation, wherein each read offset table group includes a plurality of read offset tables.

18. The method of claim 17, further comprising:
selecting a read offset table from the selected read offset table group based on a difference between the first read voltage level and the second read voltage level, wherein the selected read offset table includes a plurality of read voltage offsets, and wherein the read voltage offset of the second word line is selected from the plurality of read voltage offsets of the selected read offset table.

19. The method of claim 16, wherein the remaining read operations including the second read operation other than the first read operation from the plurality of read operations are performed using the third read voltage level without a read retry operation after each of the remaining read operations is performed.

* * * * *